United States Patent
Hallam et al.

(10) Patent No.: US 9,947,821 B2
(45) Date of Patent: Apr. 17, 2018

(54) HIGH CONCENTRATION DOPING IN SILICON

(71) Applicant: NewSouth Innovations Pty Limited, Sydney, New South Wales (AU)

(72) Inventors: Brett Jason Hallam, Bexley (AU); Matthew Bruce Edwards, Elanora Heights (AU); Stuart Ross Wenham, Cronulla (AU); Phillip George Hamer, Kensington (AU); Catherine Emily Chan, Randwick (AU); Chee Mun Chong, Bellevue Hill (AU); Pei Hsuan Lu, Rockdale (AU); Ly Mai, Sefton (AU); Li Hui Song, Kingsford (AU); Adeline Sugianto, Malabar (AU); Alison Maree Wenham, Cronulla (AU); Guang Qi Xu, Randwick (AU)

(73) Assignee: Newsouth Innovations PTY Limited, New South Wales (AU)

( * ) Notice: Subject to any disclaimer, the term of this patent is extended or adjusted under 35 U.S.C. 154(b) by 0 days.

(21) Appl. No.: 14/905,710

(22) PCT Filed: Jul. 24, 2014

(86) PCT No.: PCT/AU2014/050146
§ 371 (c)(1),
(2) Date: Jan. 15, 2016

(87) PCT Pub. No.: WO2015/010167
PCT Pub. Date: Jan. 29, 2015

(65) Prior Publication Data
US 2016/0225930 A1  Aug. 4, 2016

(30) Foreign Application Priority Data

Jul. 26, 2013 (AU) ................................ 2013902773

(51) Int. Cl.
*H01L 21/324* (2006.01)
*H01L 31/068* (2012.01)
(Continued)

(52) U.S. Cl.
CPC ........ *H01L 31/068* (2013.01); *H01L 21/2225* (2013.01); *H01L 21/2255* (2013.01);
(Continued)

(58) Field of Classification Search
CPC ............. H01L 21/3003; H01L 21/3221; H01L 21/3225; H01L 21/324; H01L 31/0288;
(Continued)

(56) References Cited

U.S. PATENT DOCUMENTS

| 4,584,028 A | 4/1986 | Pankove et al. |
| 5,304,509 A * | 4/1994 | Sopori ................ H01L 21/3003 136/258 |

(Continued)

FOREIGN PATENT DOCUMENTS

| WO | WO 1994/005036 | 3/1994 |
| WO | WO 2004/107433 | 12/2004 |
| WO | WO-2013/173867 | 11/2013 |

OTHER PUBLICATIONS

International Search Report and Written Opinion for Application No. PCT/AU2014/050146, dated Sep. 15, 2014, 12 pages.
(Continued)

*Primary Examiner* — Stephen W Smoot
(74) *Attorney, Agent, or Firm* — Nathan S. Smith; McDermott Will & Emery LLP

(57) ABSTRACT

A silicon device, has a plurality of crystalline silicon regions. One crystalline silicon region is a doped crystalline silicon region. Deactivating some or all of the dopant atoms in the doped crystalline silicon region is achieved by introducing hydrogen atoms into the doped 5 crystalline silicon (Continued)

region, whereby the hydrogen coulombicly bonds with some or all of the dopant atoms to deactivate the respective dopant atoms. Deactivated dopant atoms may be reactivated by heating and illuminating the doped crystalline silicon region to break at least some of the dopant-hydrogen bonds while maintaining conditions to create a high concentration of neutral hydrogen atoms whereby 10 some of the hydrogen atoms diffuse from the doped crystalline silicon region without rebinding to the dopant atoms.

26 Claims, 14 Drawing Sheets

(51) Int. Cl.
*H01L 21/30* (2006.01)
*H01L 21/22* (2006.01)
*H01L 21/225* (2006.01)
*H01L 31/18* (2006.01)
*H01L 31/0288* (2006.01)
*H01L 31/0352* (2006.01)

(52) U.S. Cl.
CPC ........ *H01L 21/3003* (2013.01); *H01L 21/324* (2013.01); *H01L 31/0288* (2013.01); *H01L 31/035272* (2013.01); *H01L 31/1804* (2013.01); *H01L 31/186* (2013.01); *H01L 31/1864* (2013.01); *H01L 31/1876* (2013.01); *Y02E 10/547* (2013.01); *Y02P 70/521* (2015.11)

(58) Field of Classification Search
CPC ............. H01L 31/1804; H01L 31/1864; Y02E 10/547
See application file for complete search history.

(56) References Cited

U.S. PATENT DOCUMENTS

| | | | | |
|---|---|---|---|---|
| 6,129,787 A | * | 10/2000 | Adachi | H01L 21/3225 117/102 |
| 6,352,909 B1 | * | 3/2002 | Usenko | H01L 21/2236 257/E21.143 |
| 7,553,772 B1 | * | 6/2009 | Gu | H01L 21/02238 257/E21.328 |
| 9,190,556 B2 | * | 11/2015 | Wenham | H01L 31/1864 |
| 2004/0048456 A1 | * | 3/2004 | Sato | H01L 29/66507 438/542 |
| 2010/0105190 A1 | * | 4/2010 | Ferre i Tomas | H01L 21/3221 438/471 |
| 2014/0246755 A1 | * | 9/2014 | Yoshimura | H01L 29/32 257/617 |

OTHER PUBLICATIONS

Zundel et al., "Light-enhanced reactivation of passivated boron in hydrogen treated silicon," Physica B: Condensed Matter, vol. 170, No. 1-4, Apr. 1991, pp. 361-364.

European Office Action dated Mar. 22, 2017, from European Patent Application No. 14828986.1, 9 pages.

* cited by examiner

HIGH CONCENTRATION DOPING IN SILICON

INTRODUCTION

The present invention relates to methods of manufacturing solar cells and in particular the invention provides new method of hydrogenation of silicon material.

BACKGROUND

Hydrogenation of crystalline silicon involves the bonding of hydrogen atoms to crystallographic defects or contamination within, the silicon lattice in a way that prevents that defect or contaminant from acting as a recombination site for minority charge carriers. This is known as passivation of the particular recombination site. This is important for semiconductor devices that require long minority carrier lifetimes such as solar cells and particularly where cheap silicon is used that often has poor crystallographic quality and/or purity and therefore needs passivation to bring the quality to acceptable levels for high efficiency solar cells.

Low cost silicon in general has much higher densities of silicon crystallographic defects and/or unwanted impurities. These lower the minority carrier lifetime of the silicon and therefore reduce the efficiencies of solar cells made from such material. Passivation of such defects and contaminants to improve minority carrier lifetimes is therefore an important part of being able to fabricate high efficiency solar cells when using lower quality silicon than that routinely used by the microelectronics industry such as with floatzone (FZ) wafers formed from semiconductor grade silicon.

Currently, without a full understanding of the hydrogenation process and its potential, the designs of commercially manufactured solar cell structures are not ideal to facilitate hydrogenation throughout the cell, and this is reflected in the poor bulk lifetimes for technologies using standard commercial grade p-type wafers.

The ability of hydrogen to move throughout silicon is greatly inhibited by interactions with dopant atoms. For example, in equilibrium in n-type silicon, almost all hydrogen is in the negative charge state ($H^-$) and in p-type silicon almost all hydrogen is in the positive charge state ($H^+$). However hydrogen in these charge states in the respective silicon polarity can lead to strong attraction between the hydrogen atom and the respective dopant atoms, making it difficult for the hydrogen atom to move past such dopant atoms. This can lead to the neutralization of the dopant atoms, and thus the hydrogen can no longer move throughout the silicon. This behaviour of hydrogen in silicon has not been well understood or has been overlooked in the past, with the result that attempts at hydrogenation have been less effective than would have been believed by cell designers.

For example, $H^+$ can interact with ionised boron atoms ($B^-$) to form neutral boron-hydrogen (B—H) complexes. Similarly, $H^-$ can interact with ionised phosphorus atoms ($P^+$) to form neutral phosphorus-hydrogen (P—H) complexes.

Boron (B) is a valency 3 element which can be used to dope silicon to produce p-type material when taking on substitutional sites within the silicon lattice. Each such boron atom therefore produces a free "hole", leaving the boron atom with a fixed negative charge. If atomic hydrogen is directed into such a p-type region and if the hydrogen takes on the positive charge state (H+), strong electrostatic forces exist between the $B^-$ and $H^+$ atoms, leading to a high probability that the two will react to form a B—H bond, therefore trapping the hydrogen atom at that location but while simultaneously deactivating the boron atom such that electronically it acts as if it were no longer there.

Conversely, phosphorus (P) is a valency 5 element which can be used to dope silicon to produce n-type material when taking on substitutional sites within the silicon lattice. Each such phosphorus atom therefore produces a free "electron", leaving the phosphorus atom with a fixed positive charge. If atomic hydrogen is directed into such an n-type region and if the hydrogen takes on the negative charge state (H–), strong electrostatic forces exist between the P+ and H– atoms, leading to a high probability that the two will react to form a P—H bond, therefore trapping the hydrogen atom at that location but while simultaneously deactivating the phosphorus atom such that electronically it acts as if it were no longer there.

The dissociation of the dopant-hydrogen complexes is difficult, as even if there is sufficient thermal energy to dissociate the complex (e.g. >150° C.), the coulombic attraction between the dopant atom and the atomic hydrogen ($H^-$ for phosphorus and $H^+$ for boron) prevents the escape of the hydrogen atom, and a rapid reformation of the dopant-hydrogen complex is likely.

It can now be seen that the main reasons for poor hydrogenation in the past include: heavy doping in emitters blocking hydrogen from penetrating deep within the silicon; absence of hydrogen sources from one or both surfaces; aluminium alloyed regions or metal/silicon interfaces acting as sinks; failure to achieve the right charge state, for the atoms of hydrogen to facilitate their bonding to certain types of defects and impurities; and no means of trapping of the hydrogen.

While heavy doping might therefore be seen as a disadvantage, understanding the mechanism that can be used to enhance hydrogenation also leads to the possibility of using heavily doped regions to advantage in other ways.

SUMMARY

According to a first aspect, a method is provided for the processing of a crystalline silicon device, having a plurality of crystalline silicon regions. The crystalline silicon device may have at least one crystalline silicon region being a doped crystalline silicon region (e.g. valency 3 dopant such as boron, aluminium gallium—or a valency 5 dopant such as phosphorus) in which some dopant atoms are deactivated by combining (coulombicly) with a hydrogen atom. The method may comprise reactivating some of the deactivated dopant atoms by heating and illuminating the doped crystalline silicon region to break at least some of the dopant-hydrogen bonds. Conditions may be simultaneously maintained to create a relatively high concentration of hydrogen atoms having a neutral charge state and/or hydrogen atoms charged with the same charge polarity as the dopant atoms. Consequently, some of the hydrogen may diffuse from the doped region without re-bonding to the dopant atoms.

The illumination may be maintained as the doped crystalline silicon region is subsequently cooled to maintain the increased concentration of hydrogen atoms having a neutral charge state and/or hydrogen atoms charged with the same charge polarity as the dopant atoms.

According to a second aspect, a method is provided for the processing of a crystalline silicon device. The method may comprise doping a crystalline silicon region of the device with dopant atoms of a first dopant polarity (e.g. p-type or n-type) to create a doped crystalline silicon region with a dopant atom concentration greater than a required final active dopant atom concentration of the doped crystalline silicon region. Subsequently some or all of the dopant atoms in the doped crystalline silicon region may be deactivated by introducing hydrogen atoms into the doped crystalline silicon region. Consequently the some of the hydrogen atoms may (coulombicly) bond with some or all of the dopant atoms of the first dopant type to deactivate the respective dopant atoms.

The doped crystalline silicon region may be a surface region of the crystalline silicon device.

According to a third aspect, a crystalline silicon device comprises a silicon region doped with a first dopant and at least some of the dopant deactivated by being bonded with hydrogen. The doped crystalline silicon region after deactivation may have a sheet resistivity which is at least 25% higher than the sheet resistivity prior to deactivation.

According to a fourth aspect a crystalline silicon device comprises a crystalline silicon region simultaneously doped with a first dopant of a first dopant polarity and a second dopant of an opposite dopant polarity. The relative concentration of the dopant of the first polarity may be greater than the dopant of the second polarity. At least some of the dopant of the first polarity may be deactivated by being bonded with hydrogen atoms such that the region after deactivation has a net active doping of the second dopant type exceeding that of the first dopant type therefore leading to the region adopting a polarity as determined by the second dopant type.

According to a fifth aspect a crystalline silicon device comprises a crystalline silicon region simultaneously doped with a first dopant of a first dopant polarity and a second dopant of an opposite dopant polarity. The relative concentration of the dopant of the first polarity may be equal to the dopant of the second polarity. At least some of the dopant of the first polarity may be deactivated by being bound with hydrogen such that the doped crystalline silicon region after deactivation has a net doping polarity of the second dopant polarity.

Some or all of the deactivated dopant atoms may subsequently be reactivated by subjecting the doped crystalline silicon region to heat in the presence of illumination whereby electron hole pairs are generated to increase the proportion of minority carriers in the doped crystalline silicon region to allow at least some of the released hydrogen atoms to take on a charge state that allows it to escape from the coulombic attraction of the dopant atom to which it was previously bonded. Subsequent cooling of the doped crystalline silicon region while preferably maintaining illumination, minimises the likelihood of the dopant atom being reactivated by hydrogen atoms.

Some or all of the deactivated dopant atoms in a selected crystalline silicon region may also be subsequently reactivated by subjecting the dopant atoms in the selected crystalline silicon region to heat and illuminating a crystalline silicon region adjacent to the selected region whereby electron hole pairs are generated to increase the proportion of minority carriers in the crystalline silicon region adjacent to the selected crystalline silicon region such that the minority carriers generated in the crystalline silicon region adjacent to the selected crystalline silicon region will diffuse to the selected crystalline silicon region and therefore allow reactivation of the dopants in the selected crystalline silicon region. Again allowing the selected crystalline silicon region to cool to below 120° C. will prevent the dopants from being deactivated again if the minority earners continue to diffuse from the adjacent crystalline silicon region. The heating and/or illumination of the dopant atoms and/or the selected crystalline silicon region and the crystalline silicon region adjacent to the selected crystalline silicon region may be performed with a laser. The laser may be scanned over a plurality of crystalline silicon regions to process a larger area or an entire cell.

Hydrogen atoms may be introduced into the crystalline silicon device by forming a dielectric which contains hydrogen, such as silicon nitride, silicon oxynitride, aluminium oxides etc. on a surface of the crystalline silicon device and subsequently heating the crystalline silicon device to migrate the hydrogen atoms into the silicon. Preferably dielectric hydrogen sources will be formed (at least temporarily) on each of the front and rear surfaces of the crystalline silicon device. In order to deliberately deactivate dopant atoms in surface regions of the crystalline silicon device, the hydrogen atoms may be introduced into the crystalline silicon device from the hydrogen source by heating the crystalline silicon device in the absence of illumination or in low illumination conditions (e.g. only unavoidable light emitting from the light source).

For hydrogen sources external to the silicon, such as dielectric layers, the method will be more effective when silicon surface n-type diffused layers through which hydrogen must diffuse have peak net active doping concentrations (i.e. dopant atoms that have not been deactivated) of $1 \times 10^{20}$ atoms/cm$^3$ or less. Similarly, the method will be more effective when any silicon surface diffused p-type layers through which hydrogen must diffuse have peak net active doping concentrations of $1 \times 10^{19}$ atoms/cm$^3$ or less.

After hydrogen has been introduced into the crystalline silicon device, the heating of the crystalline silicon device may comprise heating at least a region of the device to at least 40° C. while simultaneously illuminating at least some of the crystalline silicon device with at least one light source whereby the cumulative power of all the incident photons with sufficient energy to generate electron hole pairs within silicon (in other words photons with energy levels above the bandgap of silicon of 1.12 eV) is at least 20 mW/cm$^2$.

The illumination from the at least one light sources may be provided at levels whereby the cumulative power of all the incident photons with sufficient energy to generate electron hole pairs within silicon is at least 50 mW/cm$^2$, or 60 mW/cm$^2$, or 70 mW/cm$^2$, or 80 mW/cm$^2$, or 90 mW/cm$^2$, or 100 mW/cm$^2$, or 150 mW/cm$^2$, 200 mW/cm$^2$, or 300 mW/cm$^2$, or 400 mW/cm$^2$, or 500 mW/cm$^2$, or 600 mW/cm$^2$, or 700 mW/cm$^2$, or 800 mW/cm$^2$, or 900 mW/cm$^2$, or 1000 mW/cm$^2$, or 1500 mW/cm$^2$, 2000 mW/cm, or 3000 mW/cm$^2$, or 5000 mW/cm$^2$, or 10000 mW/cm$^2$, or 15000 mW/cm$^2$, or 20000 mW/cm$^2$, or up to a light intensity at which silicon begins to melt.

Preferably, for each of the ranges of cumulative power mentioned above, the heating of the crystalline silicon device may comprise heating at least, a region of the device to at least 100° C. The heating may be followed by cooling of the crystalline silicon device while simultaneously illuminating at least some of the device with at least one light source whereby the cumulative power of all the incident photons with sufficient energy to generate electron hole pairs within silicon is at least 20 mW/cm$^2$. Alternatively the heating of the crystalline silicon device may comprise heating the device to at least 140° C. Further, the heating of the crystalline silicon device may comprise heating the device to at least 180° C., or 200° C. or 400° C. depending on the conditions required and the thermal sensitivity of existing structures in the device. Where thermal sensitivity of structures is not an issue, even higher temperatures may be employed such as to at least 500° C., or to at least 600° C., or to at least 700° C. or to at least 800° C., or to at least 900° C., or to at least 1,000° C., or to at least 1,200° C. or to a temperature at which crystalline silicon begins to melt. In general, for a given device, the lower the temperature, the higher the corresponding light intensity will need to be for optimal hydrogenation.

Minority carrier concentrations may be controlled, through the use of light and heat, during a cool-down period after heating, and any post hydrogenation thermal processes, to maintain hydrogen charge states during cool-down to minimise reactivation of defects, or reactivation of dopants, to which hydrogen atoms have previously bound.

The intensity of illumination applied to the crystalline silicon device may be varied during the thermal processing and cooling. The intensity of illumination applied to the crystalline silicon device may be increased, or decreased, during a cooling stage after the hydrogenation or other thermal processes. In particular the intensity of illumination applied to the crystalline silicon device may be increased, or decreased, with decreasing temperature of the device.

During a hydrogenation process, or during a process performed at greater than 200° C. after a hydrogenation process and/or during cooling after such a process, the source of illumination applied to the crystalline silicon device may be an array of LEDs. The source of illumination applied to the crystalline silicon device may also be one or more infrared lamps. The illumination applied to the device may be pulsed. The intensity of illumination applied to the crystalline silicon device may be controlled to maintain the Fermi level at a value of 0.10 to 0.22 ev above mid-gap.

The method may be used to process silicon for use in the fabrication of a photovoltaic device having at least one rectifying junction.

The dopant introduced in excess of requirements may be a p-type (valency 3) dopant such as boron, aluminium or gallium or an n-type (valency 5) dopant such as phosphorus. The method is particularly effective when boron is used as a dopant in silicon. The doped region may also be doped with boron and phosphorus.

Intentional addition of dopants into the silicon wafers of photovoltaic cells for subsequent deactivation and/or reactivation during hydrogenation processes enables the active dopant concentrations to be altered e.g. local hydrogenation to form selective emitters, as well as storing and releasing of hydrogen to subsequently act as a hydrogen source internally to the silicon wafer.

The deliberate addition of extra dopants, such as boron, into specific areas of a silicon wafer to reduce the sheet resistivity in those areas to levels that are lower than ultimately required thereby making possible subsequent deactivation of some or all of the added dopants by hydrogen so as to raise the resistivity in the specific region. Such regions may optionally be appropriately treated with light and heat to subsequently reactivate some of the deactivated dopants while simultaneously releasing atomic hydrogen that is able to act as a hydrogen passivation source internal to the silicon wafer or at its surfaces. An example is to diffuse the entire surface region of a silicon wafer with additional dopant followed by hydrogen deactivation of some or all of the added atoms. Subsequent application of heat and light can be used to reactivate some or all of the dopants over the entire surface region or in localised regions to either provide a full area or localised hydrogen source internal to the silicon or else to create a doped structure with a varying sheet resistivity profile with lowest sheet resistivity in localised regions where most dopant atoms are reactivated.

Such surface layers can even include the deliberate addition of two opposite polarity dopants, such as boron and phosphorus, whereby the layer is p-type prior to boron deactivation, n-type after deactivation by hydrogen and then with localised p-type and n-type regions after localised reactivation of boron atoms takes place. Depending on the localised application of heat and light the boron dopants are locally reactivated to allow such regions to return from n-type to being p-type. Such p-type regions can penetrate from one surface of the wafer through to the opposite surface for various purposes such as to form conductive vias or else to create isolating regions of p-type that electrically isolate adjacent n-type regions on either side of the p-type region such as for series interconnecting adjacent devices on the same wafer, and can include points, dashes, lines or any other geometry based on the pattern used in the application of the light and heat to locally reactivate the boron dopants.

BRIEF DESCRIPTION OF THE DRAWINGS

Embodiments of the invention will now be describe, by way of example with reference to the accompanying drawings in which.

DETAILED DESCRIPTION

Processes described herein provide & method for altering the active dopant density through simple hydrogenation processes, by either deactivating or reactivating dopants, while also facilitating storing or releasing hydrogen as a source internal to the silicon respectively. This uniquely provides the opportunity for creating a hydrogen source internally within the silicon that can be exploited later for hydrogenation purposes by releasing the atomic hydrogen through the process of reactivating dopant atoms. Such strategy can also be used on a localised scale to reactivate localised doped regions so as to create a selective emitter structure. This provides a very simple mechanism for forming selective emitters—using only heat and light to manipulate the charge state of hydrogen in such a way as to facilitate deactivation or reactivation of dopants in localised areas as and where required.

Figure 1:
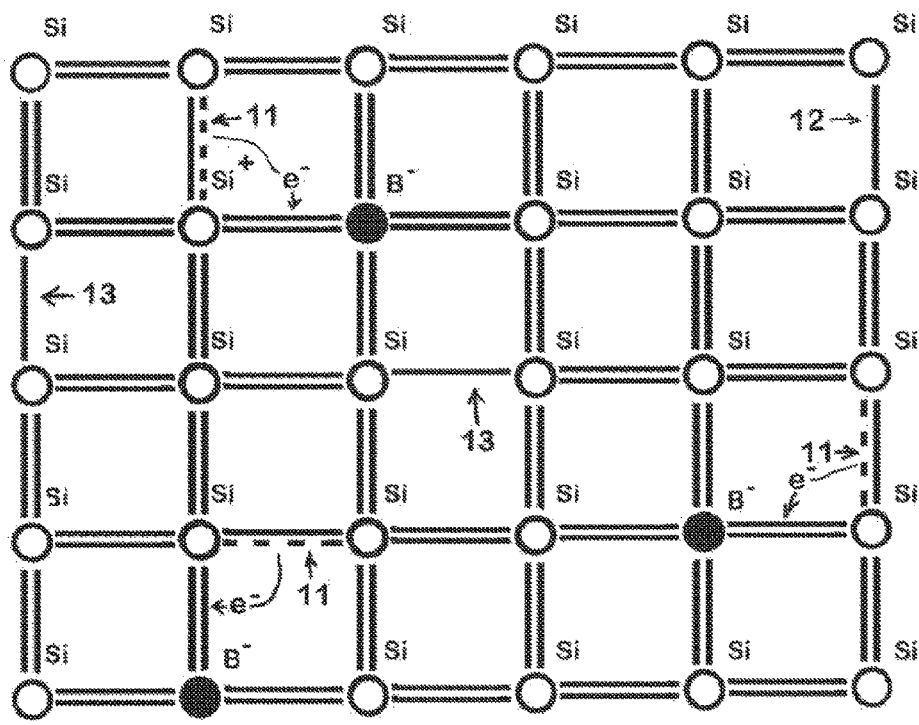
FIG. 1 diagrammatically represents a p-type silicon crystal lattice structure (boron doped)
Figure 2:
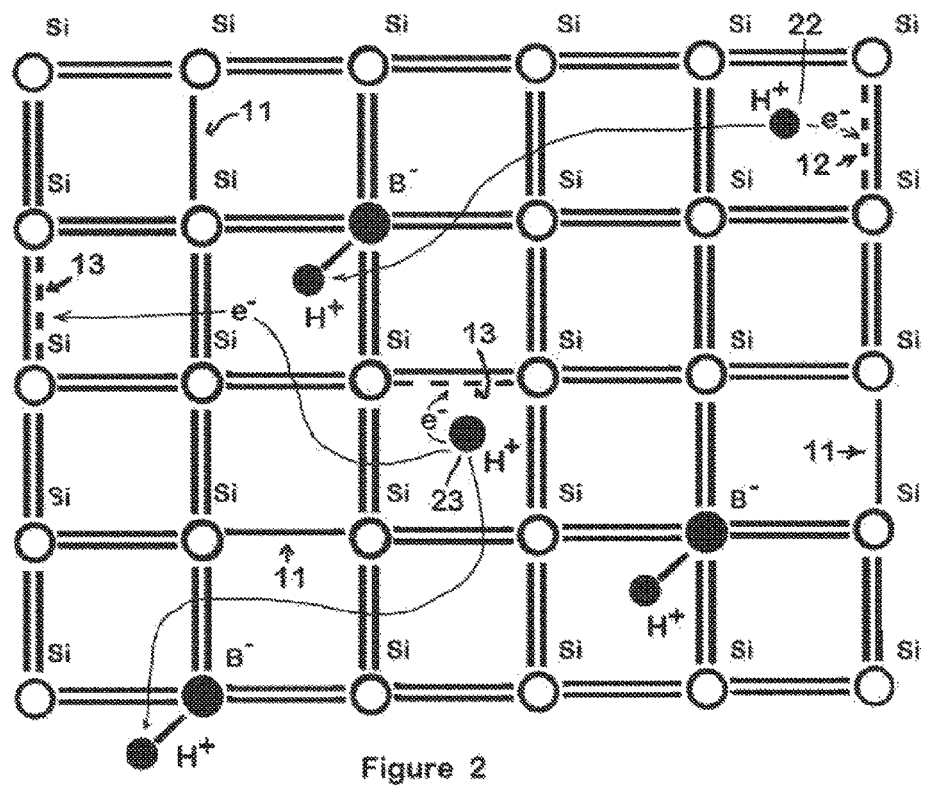
FIG. 2 diagrammatically represents the p-type silicon crystal lattice structure of FIG. 1 after hydrogenation.

As mentioned in the 'Background' above, boron (B) is a valency 3 element which can be used to dope silicon to produce p-type material when taking on substitutional sites within the silicon lattice, as illustrated in FIG. 1. Each such boron atom therefore produces a free "hole" 11, leaving the boron atom with a fixed negative charge. Additional holes 12, 13 are seen in FIG. 1, which will have moved away from the doping sights where they were created. Referring to FIG. 2, if neutral atomic hydrogen 22 drifts into such a p-type region and if the hydrogen takes on the positive charge state ($H^+$), such as by giving up an electron which may subsequently combine with a hole 12 as the hydrogen passes through the silicon lattice, strong electrostatic forces exist between the $B^-$ and $H^+$ atoms, leading to a high probability that the two will react to form a B—H bond, therefore trapping the hydrogen atom at that location but while simultaneously deactivating the boron atom such that electronically it acts as if it were no longer present. Similarly, if a negative hydrogen ion 23 drifts into such a p-type region, the hydrogen may take on the positive charge state ($H^+$), by giving up two electrons which may subsequently combine with a holes 13 as the hydrogen passes through the silicon lattice.

Figure 3:
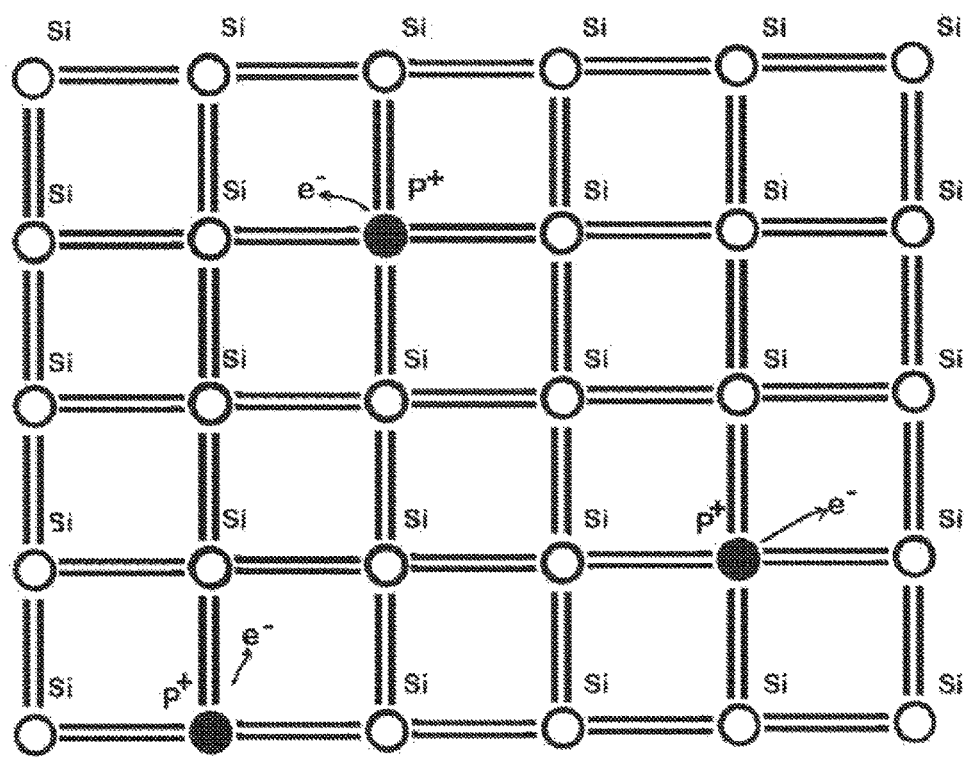
FIG. 3 diagrammatically represents an n-type silicon crystal lattice structure (phosphorus doped)
Figure 4:
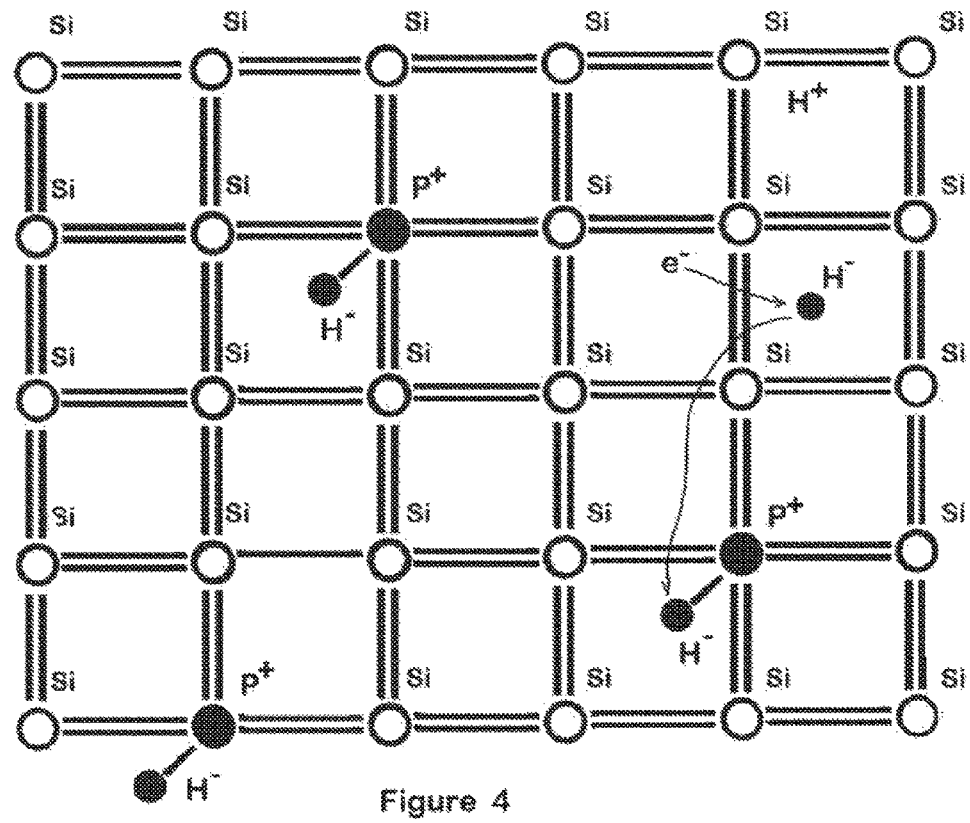
FIG. 4 diagrammatically represents the n-type silicon crystal lattice structure of FIG. 3 after hydrogenation.

Similarly, phosphorus (P) is a valency 5 element which can be used to dope silicon to produce n-type material when taking on substitutional sites within the silicon lattice, as illustrated in FIG. 3. Each such phosphorus atom therefore produces a free "electron" 31, leaving the phosphorus atom with a fixed positive charge. Referring to FIG. 4, if neutral atomic hydrogen is directed into such an n-type region and if an electron joins the hydrogen atom such that the hydrogen takes on the negative charge state (H−), strong electrostatic forces exist between the P+ and H− atoms, leading to a high probability that the two will react to form a P—H bond, therefore trapping the hydrogen atom at that location but while simultaneously deactivating the phosphorus atom such that electronically it acts as if it were no longer there. Similarly, if a positively charged hydrogen ion drifts into such an n-type region, the hydrogen may take on a negative charge state ($H^-$) by two electrons joining the $H^+$ atom, strong electrostatic forces will exist between the $P^+$ and $H^-$ atoms.

The dissociation of the dopant-hydrogen complexes is difficult, as even if there is sufficient thermal energy to dissociate the complex, the Coulombic attraction between the dopant atom and the atomic hydrogen ($H^-$ for phosphorus and $H^+$ for boron) prevents the escape of the hydrogen atom, and a rapid reformation of the dopant-hydrogen complex is likely. Thus if excessive dopant is added to a silicon device, hydrogen may be introduced in the appropriate charge state to deactivate the dopant. The dominant charge state for hydrogen in p-type silicon is $H^+$ and thus it is relatively simple to deactivate boron, dopant atoms close to a silicon surface, however the $H^+$ will not have high mobility and will not travel far before being captured. In the simple case the charge state may be altered by heating which can allow $H^+$ to penetrate further into a doped region and with removal of the heat source will lock the hydrogen in when it has bonded with a dopant. However heating alone is less effective when trying to release hydrogen that is bonded to dopant atoms, to reactivate the dopant atoms, as the hydrogen will re-bond, particularly during cooling. Similarly in n-type silicon, $H^-$ is the dominant charge state and while heating will help in increasing the size of the region of deactivation of n-type dopant atoms, it will not be particularly effective in reactivation.

Figure 5:
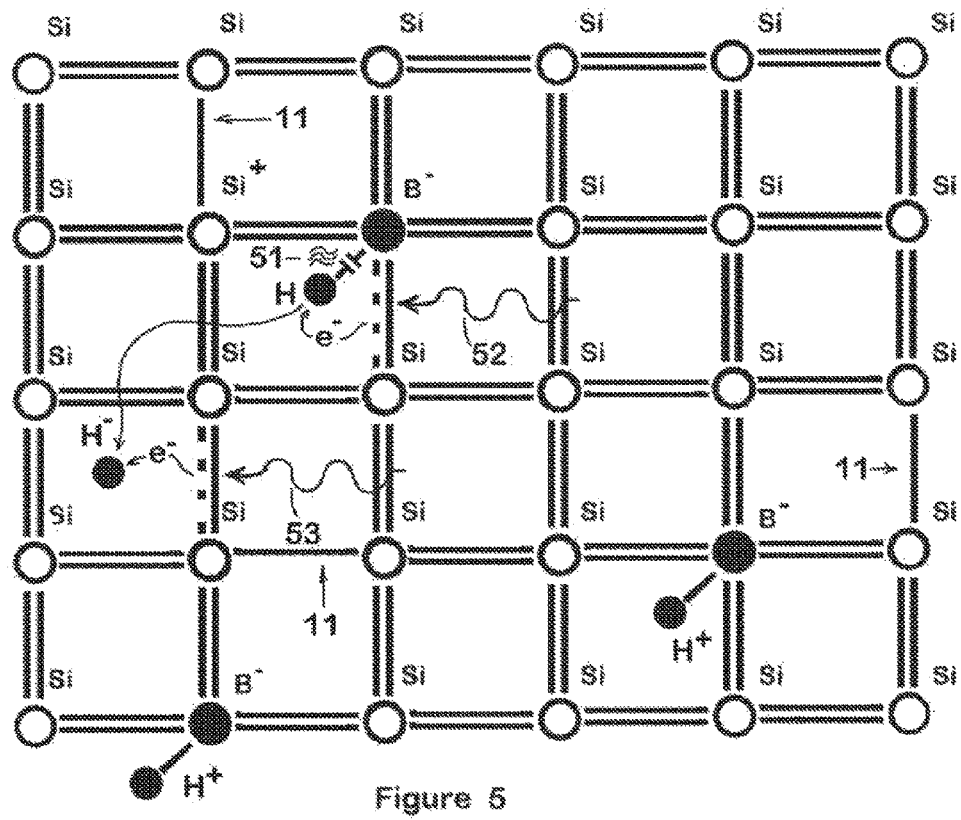
FIG. 5 diagrammatically represents the p-type silicon crystal lattice structure of FIG. 2 showing the reactivation of the boron dopant with the application of heat and light.
Figure 6:
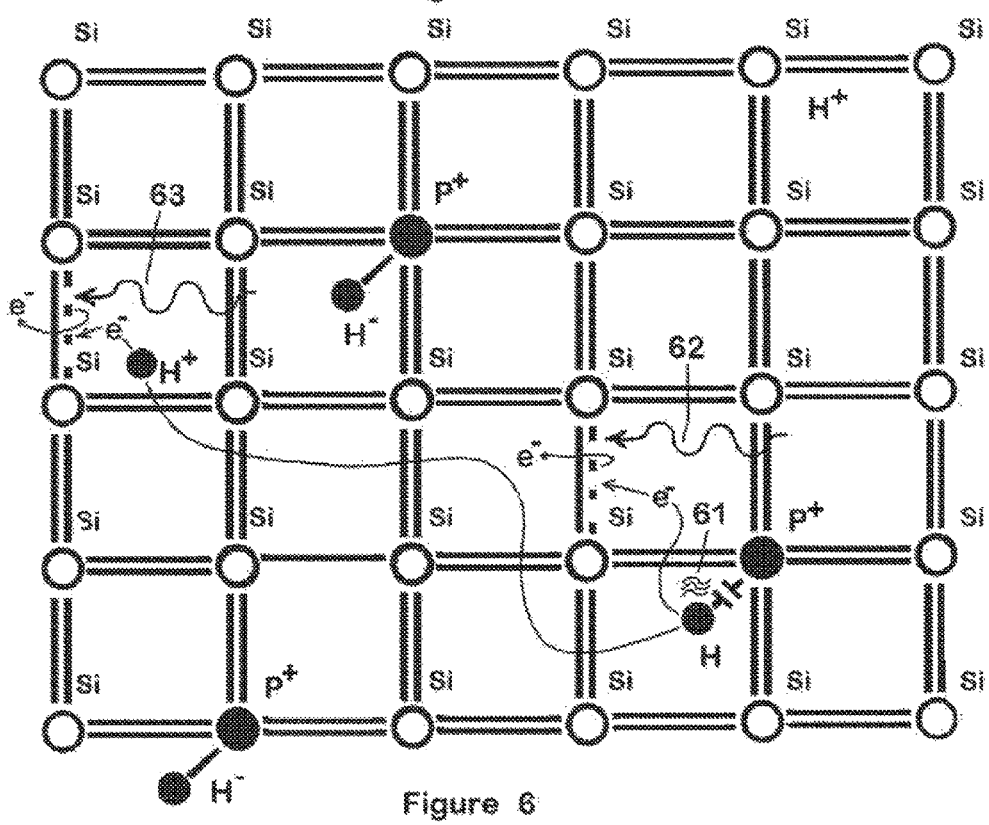
FIG. 6 diagrammatically represents the n-type silicon crystal lattice structure of FIG. 4 showing the reactivation of the phosphorus dopant with the application of heat and light.

Referring to FIGS. 5 & 6, by increasing the minority carrier concentration (the electrons within the p-type silicon or the holes within n-type silicon), it is possible to greatly increase the concentration of hydrogen atoms in the neutral charge state, or even to cause hydrogen atoms to adopt the same charge state as the ionised dopants atoms of the doped region (so in the case of boron doped material where the ionised boron atoms will be negatively charged, the hydrogen atoms may be caused to become negatively charged also, refilling in the hydrogen and boron repelling one another). This can be achieved somewhat by heating the silicon wafer, but is far more effective when the wafer is simultaneously illuminated with bright light to generate many additional minority carriers. Without the bright light, the temperature needed to sufficient increase the minority carrier concentrations is too great and causes damage to the device being fabricated and the effect will naturally reverse during cooling. With the combination of heat and light, the minority carrier concentrations can be increased sufficiently to allow a large increase in the concentration of hydrogen atoms that have a single electron attached to the hydrogen atom nucleus, therefore giving neutral charge state. It is also possible to significantly increase in the concentration of hydrogen atoms that have two electrons attached to the hydrogen atom nucleus, therefore giving a negative charge state. Thus it is possible to create the hydrogen atoms that are no longer impeded by the strong coulombic forces from the fixed negative or positive ions in the lattice that otherwise drastically reduce its mobility allowing the hydrogen to move away from the dopant atoms to which it would otherwise bond. The neutral hydrogen atoms (and negative Hydrogen ions) are also more effective at bonding to many types of recombination sites due to the presence of the electron with the hydrogen atom. As seen in FIG. 5, the coulombic forces holding hydrogen and boron atoms together may be disrupted by thermal energy 51, releasing $H^+$ ions, while photons 52, 53 striking the silicon lattice may release electrons to form electron-hole pairs. Some of the thus generated electrons will then be free to combine with the $H^+$ ions to form neutral hydrogen atoms. In FIG. 5 it can be seen that if sufficient electrons are present, the hydrogen may join with more than one electron to form a negative hydrogen ion. The equivalent process for n-type material is illustrated in FIG. 6 where the coulombic forces holding hydrogen and boron atoms together may again be disrupted by thermal energy 61, releasing $H^-$ ions. Photons 62, 63 striking the silicon lattice may release electrons to form electron-hole pairs and the $H^-$ ions may subsequently donate one of their electrons to one of the generated holes (which, although shown in FIG. 6 to be adjacent to the dopant that generated it, may have in fact moved away) to form neutral hydrogen atoms.

Thus there are four advantages that be achieved by overdoping regions on the device:

1) active dopant concentration may be controlled by deactivation and reactivation of dopants as required;
2) the above (1) can take place in localised areas so as to create localised regions of varying active doping concentration and even varying polarity such as may be useful for selective emitters or isolation regions;
3) over doped regions that are subsequently deactivated with hydrogen can later be used as internal hydrogen sources for hydrogenation of defects;
4) over doped regions that are subsequently deactivated with hydrogen can later be used to facilitate localised internal hydrogen sources for hydrogenation of localised defects or regions either during device fabrication or following device completion.

EXAMPLES

1. Deliberate Addition of Extra Boron (B) and Subsequent Deactivation by Hydrogen in Localised Areas to Form a Selective Emitter Boron (or other dopants) can be intentionally added to the silicon. By manipulating the charge state of hydrogen in some or all areas of the device and providing sufficient thermal energy (typically 150°-500° C.) to increase the amount and mobility of the hydrogen, the boron can be de-activated (or re-activated as desired)—by enabling boron & hydrogen to bond together (or break and separate if boron reactivation is desired). This has many important implementations such as profiling resistivity in an emitter to form a selective Emitter, which can be done in a number of ways including but not limited to:

(i) Example 1—Local Deactivation

Figure 7:
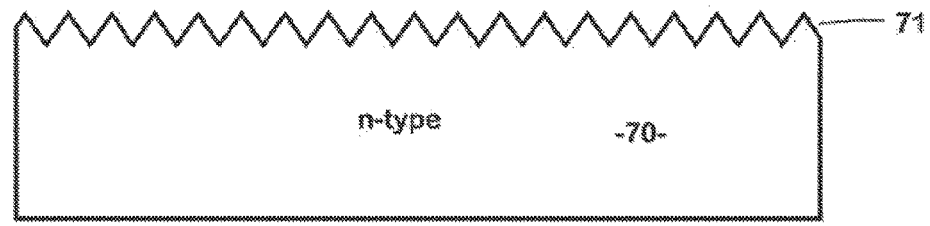
FIG. 7 diagrammatically illustrates a textured n-type wafer in which an embodiment of the invention may be formed.
Figure 8:
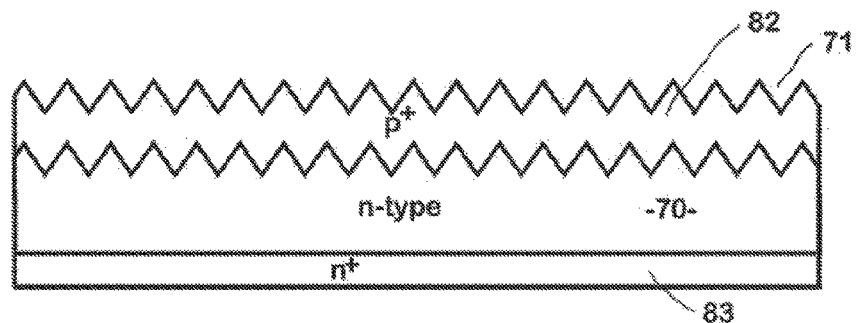
FIG. 8 diagrammatically illustrates the wafer of FIG. 7 after initial doping of the front and rear surfaces.
Figure 9:
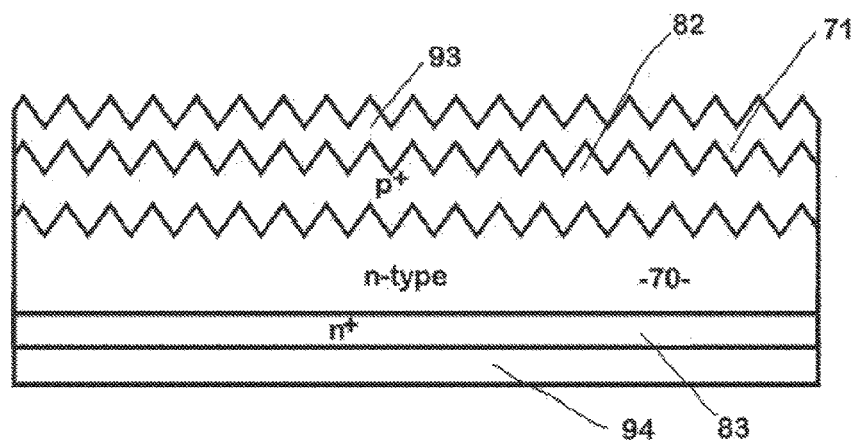
FIG. 9 diagrammatically illustrates the wafer of FIG. 8 after dielectric layers are added.
Figure 10:
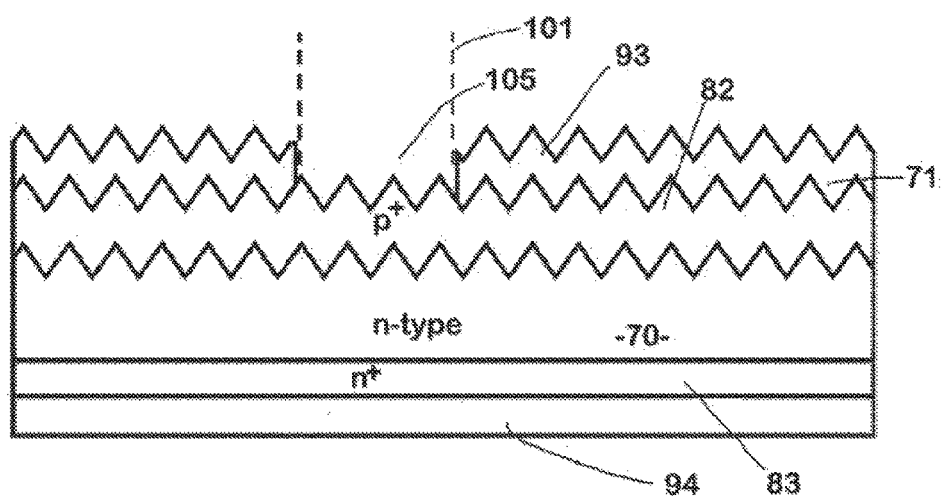
FIG. 10 diagrammatically illustrates the wafer of FIG. 8 after patterning of the top surface dielectric.
Figure 11:
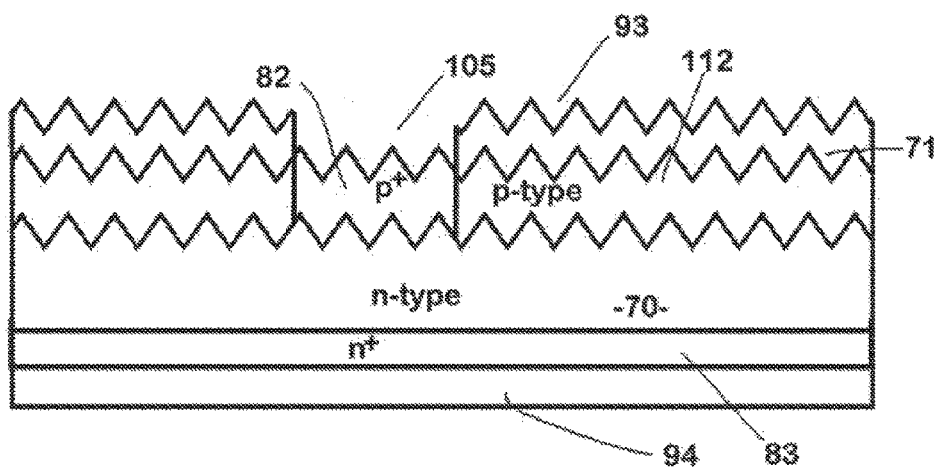
FIG. 11 diagrammatically illustrates the wafer of FIG. 10 after hydrogenation of the emitter region.
Figure 12:
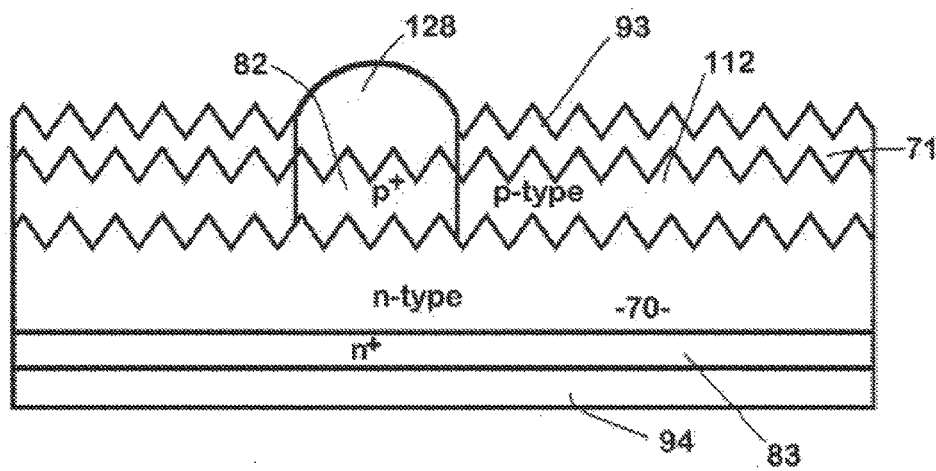
FIG. 12 diagrammatically illustrates the wafer of FIG. 11 after emitter metallisation is applied.
Figure 13:
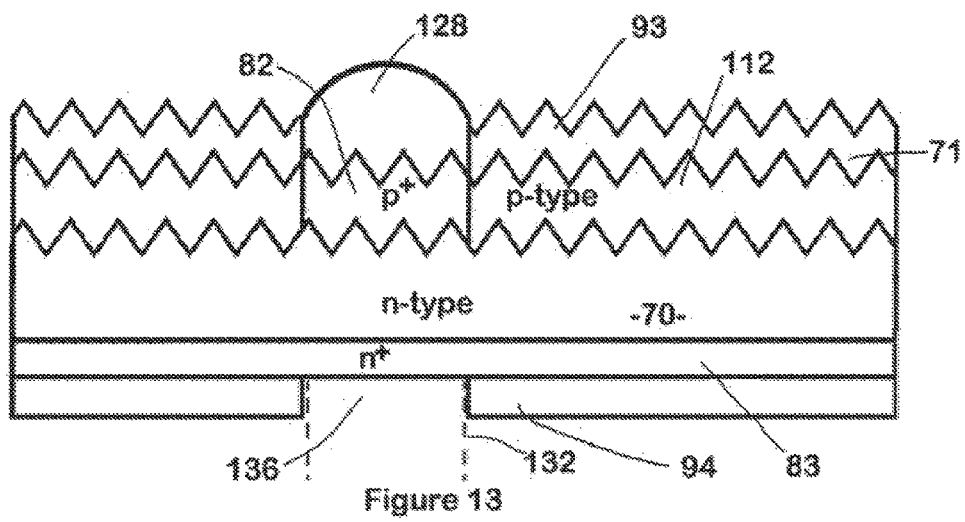
FIG. 13 diagrammatically illustrates the wafer of FIG. 12 after patterning of the rear surface dielectric.

1) Referring to FIG. 7, an n-type wafer 70 is textured 71;
2) A boron diffusion of the top surface to notionally achieve a $p^+$ region with a sheet resistance of 45-55Ω/□ (but which could be anywhere within a range of 1-80Ω/□) creates an emitter layer 82 seen in FIG. 8;
3) A phosphorus diffusion 93 may also be added to the rear surface to again notionally achieve an $n^+$ region with a sheet resistance of 45-55Ω/□ (but which could be anywhere within a range of 1-80Ω/□) as also seen in FIG. 8;
4) A front surface dielectric layer 93 and a rear surface dielectric layer 94 are then deposited as seen in FIG. 9. The dielectric layers 93 & 94 act as hydrogen sources and may be selected from hydrogen containing dielectric materials such as silicon nitride, silicon oxynitride, aluminium oxides etc.;
5) The front surface dielectric layer 93 is patterned as seen in FIG. 10, to create openings 105 for emitter metallisation. This can be done by a laser 101, by screen printing or inkjet patterning or other suitable known processes;
6) Referring to FIG. 11, hydrogenation of the emitter is performed, in areas of silicon 112 where the dielectric 93 has not been removed (i.e. where hydrogen source is present), such as by heating the de vice to 400° C. in darkness or in low light. This process manipulates the charge state in such a way that boron is deactivated wherever hydrogen is present. Boron is deactivated by hydrogen which bonds with the negative boron atoms that are active in the silicon lattice. Hydrogenation performed in a manner which maximises the amount of $H^+$ present will enable the $H^+$ to bond with the $B^-$ thereby de-activating the boron and creating higher sheet resistivity material in these regions, while leaving lower sheet resistivity regions 82 where the dielectric hydrogen source has been removed to form openings 105 for the subsequent formation of metal contacts. Note that the percentage of atomic hydrogen in the positive charge state is maximised by keeping the electron concentration low such as by minimising the light generated by the heating sources which have photons with energy levels above the bandgap of silicon (1.12 eV) and by avoiding temperatures significantly above the range of 300°-500° C. necessary for reasonable hydrogen mobility and the release of hydrogen from the dielectric hydrogen sources 93.
7) Metal contacts 128 may then be applied to the exposed $p^+$ regions 82, such as by plating or aligned screen printing, as seen in FIG. 12.
8) The rear surface dielectric layer 94 is patterned as seen in FIG. 13, to create openings 136 for rear metallisation. This can be done by a laser 132, by screen printing or inkjet patterning or other suitable known processes;
9) Referring to FIG. 14, hydrogenation of the n+ region of the rear surface is performed, in areas of silicon 141 where the dielectric 94 has not been removed (i.e. where hydrogen source is present), such as by heating the device to 400° C. in darkness or low light. This process manipulates the charge state to maximise the $H^-$ concentration while still allowing release of hydrogen from the hydrogen source in such a way that phosphorus is deactivated wherever hydrogen is present. Phosphorus is deactivated by hydrogen which bonds with the positive phosphorus atoms that are active in the silicon lattice. Hydrogenation performed in a manner which maximises the amount of $H^-$ present will enable the $H^-$ to bond with the $P^+$ thereby de-activating the phosphorus and creating higher sheet resistivity material in these regions, while leaving lower sheet resistivity regions 83 where the dielectric hydrogen source 94 has been removed to form openings 136 for the subsequent formation of metal contacts. Note that the percentage of atomic hydrogen in the negative charge state is maximised by keeping the hole concentration low such as by minimising the light generated by the heating sources which have photons with energy levels above the bandgap of silicon (1.12 eV) and by avoiding temperatures significantly above the 300-500° C. range that is desirable for reasonable hydrogen mobility and the release of hydrogen from the dielectric hydrogen sources 94.

For simplicity, the identical conditions have been described for boron and phosphorus deactivation so as to facilitate simultaneous deactivation of both the boron at the front and phosphorus at, the rear, which would removes step 9 but would require the rear opening step (step 8) to be performed before the hydrogenation step (step 6). However for optimal electronic performance, different hydrogenation (deactivation) processing conditions may be beneficial for the boron and phosphorus such that the two processes should therefore be carried out separately as described above with reference to FIGS. 7-15.

Figure 15:
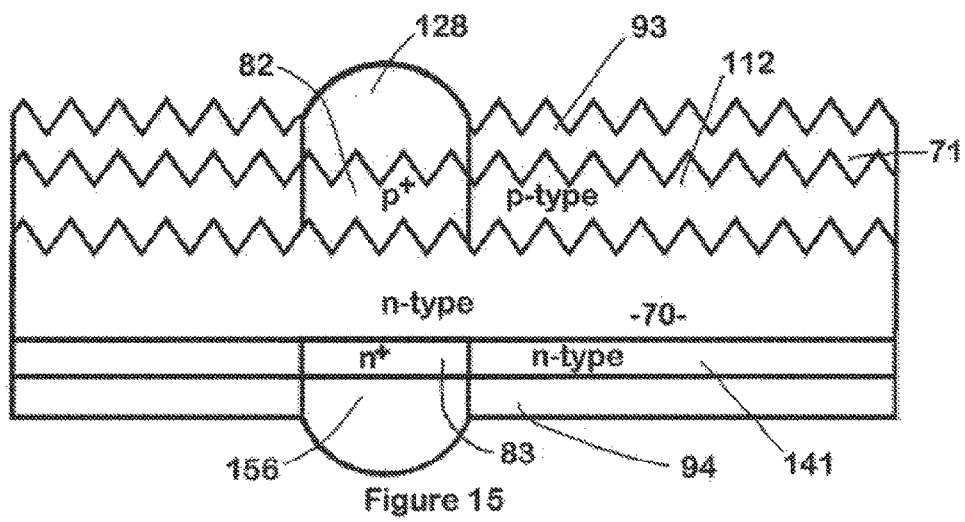
FIG. 15 diagrammatically illustrates the wafer of FIG. 14 after rear surface metallisation is applied.

10) Metal contacts 156 may then be applied to the exposed n$^+$ regions 83, such as by plating or aligned screen printing, as seen in FIG. 15.

(ii) Example 2—Local Deactivation

Figure 16:
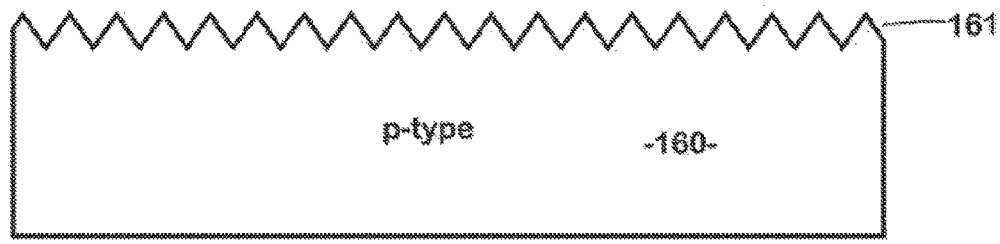
FIG. 16 diagrammatically illustrates a textured p-type wafer in which an embodiment of the invention may be formed.
Figure 17:
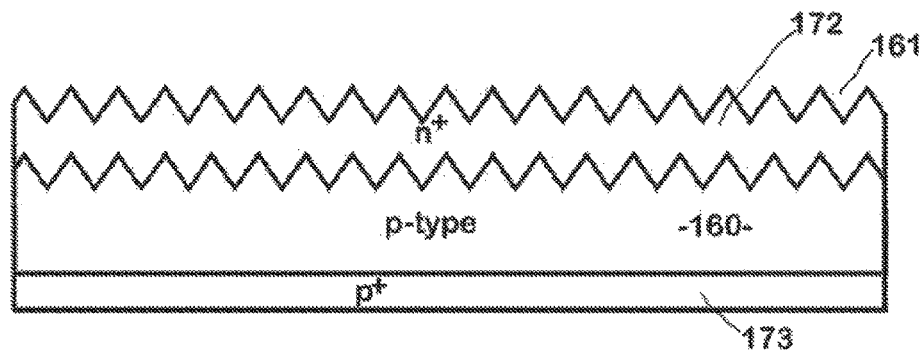
FIG. 17 diagrammatically illustrates the wafer of FIG. 16 after initial doping of the front and rear surfaces.
Figure 18:
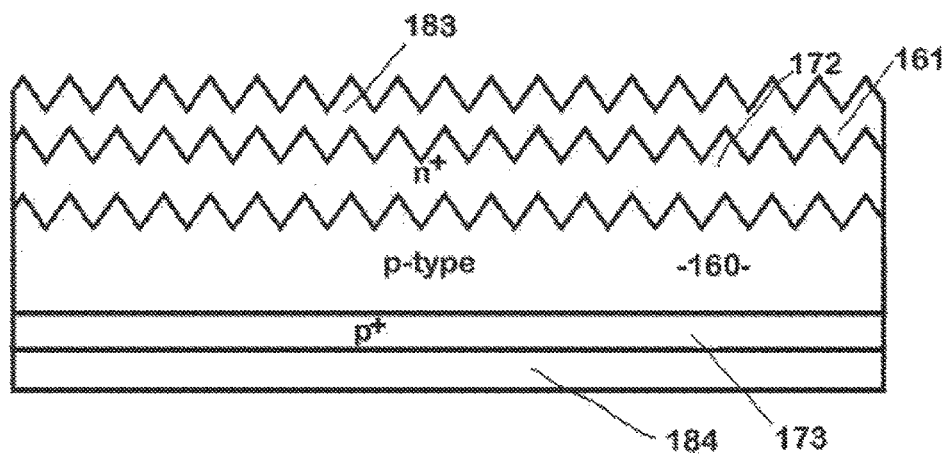
FIG. 18 diagrammatically illustrates the wafer of FIG. 17 after dielectric layers are added.
Figure 19:
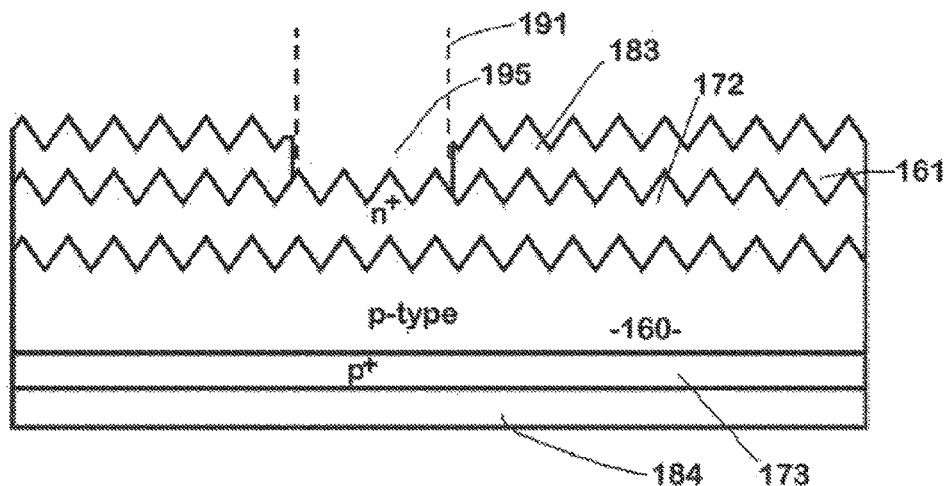
FIG. 19 diagrammatically illustrates the wafer of FIG. 18 after patterning of the top surface dielectric.
Figure 20:
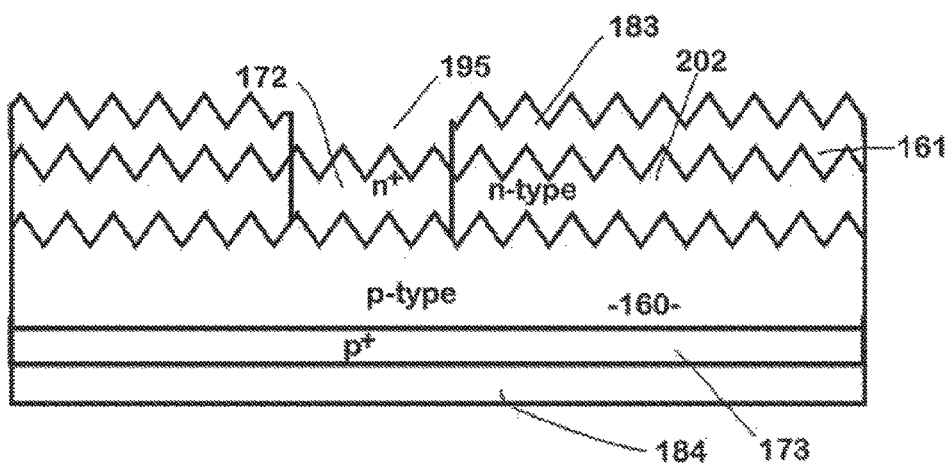
FIG. 20 diagrammatically illustrates the wafer of FIG. 19 after hydrogenation of the emitter region.

1) Referring to FIG. 16, a p-type wafer 160 is textured 161;
2) A phosphorus diffusion of the top surface to notionally achieve an n$^+$ region with a sheet resistance of 45-55Ω/□ (but which could be anywhere within a range of 1-80Ω/□) creates an emitter layer 172 seen in FIG. 17;
3) A boron diffusion 173 may also be added to the rear surface to again notionally achieve an p$^-$ region with a sheet, resistance of 45-55Ω/□ (but which could be anywhere within a range of 1-80Ω/□) as also seen in FIG. 17;
4) A front surface dielectric layer 183 and a rear surface dielectric layer 184 are then deposited as seen in FIG. 18. The dielectric layers 183 & 184 act as hydrogen sources and may be selected from hydrogen containing dielectric materials such as silicon nitride, silicon oxynitride, aluminium oxides etc.;
5) The front surface dielectric layer 183 is patterned as seen in FIG. 19, to create openings 195 for emitter metallisation. This can be done by a laser 191, by screen printing or inkjet patterning or other suitable known processes;
6) Referring to FIG. 20, hydrogenation of the emitter is performed, in areas of silicon 202 where the dielectric 183 has not been removed (i.e. where hydrogen source is present), such as by heating the device to 400° C. in darkness or low light. This process manipulates the charge state in such a way that phosphorus is deactivated wherever hydrogen is present. Phosphorus is deactivated by hydrogen (H$^-$) which bonds with the positive phosphorus atoms that, are active in the silicon lattice. Hydrogenation performed in a manner which maximises the amount of H$^-$ present will enable the H$^-$ to bond with the P$^+$ thereby de-activating the phosphorus and creating, higher sheet resistivity material in these regions, while leaving lower sheet resistivity regions 172 where the dielectric hydrogen source has been removed to form openings 195 for the subsequent formation of metal contacts. Note that the percentage of atomic hydrogen in the negative charge state is maximised by keeping the hole concentration low such as by minimising the light generation of carriers by minimising the light from the heaters generated by the heating sources which have photons with energy levels above the bandgap of silicon (1.12 eV) and by avoiding temperatures significantly above 300-500° C. that is typically necessary for reasonable hydrogen mobility and the release of hydrogen from the dielectric hydrogen sources 183.

Figure 21:
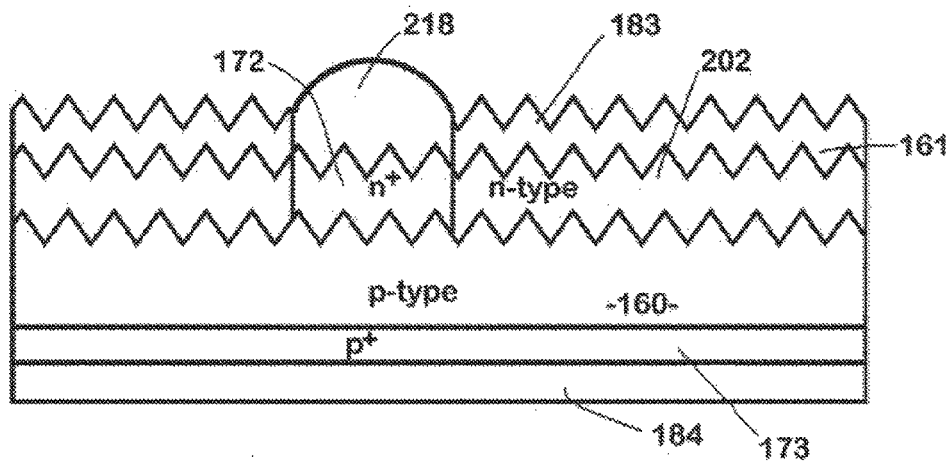
FIG. 21 diagrammatically illustrates the wafer of FIG. 20 after emitter metallisation is applied.
Figure 22:
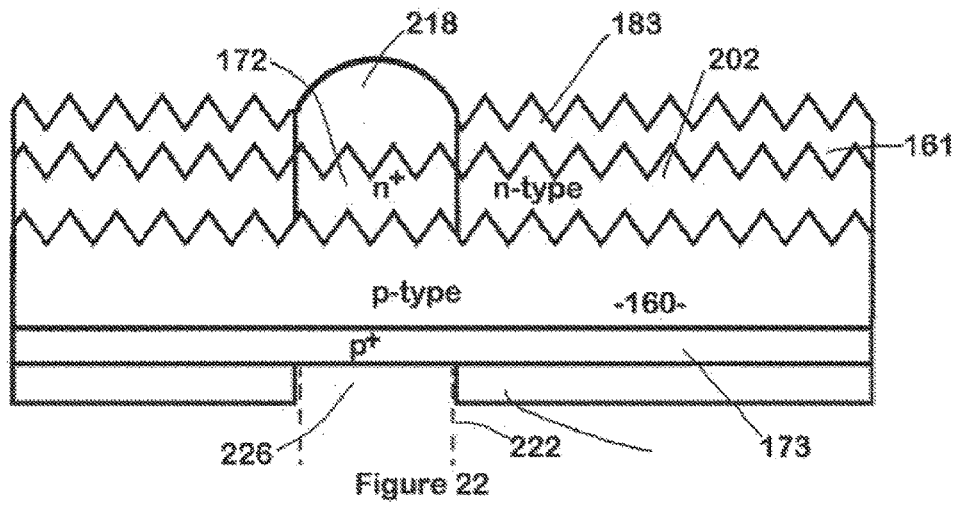
FIG. 22 diagrammatically illustrates the wafer of FIG. 21 after patterning of the rear surface dielectric.
Figure 23:
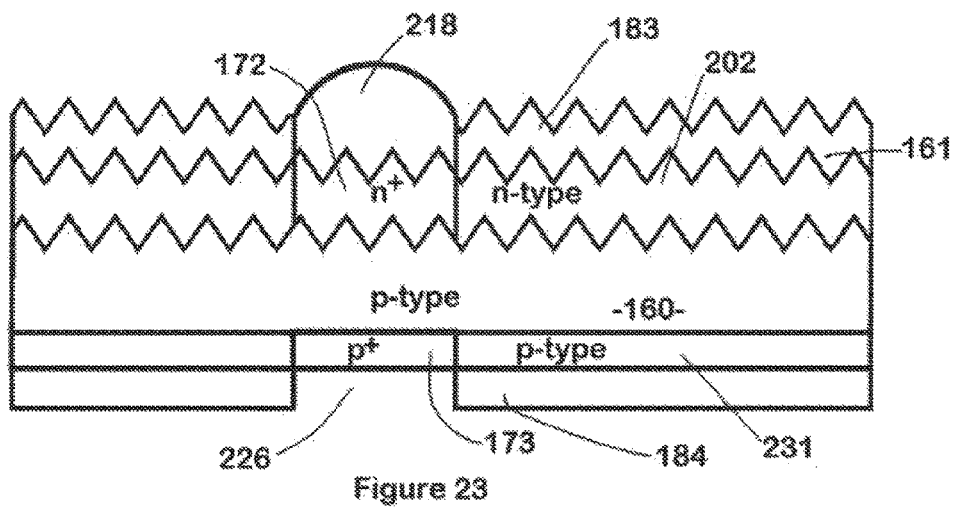
FIG. 23 diagrammatically illustrates the wafer of FIG. 22 after hydrogenation of the rear doped region.

7) Metal contacts 218 may then be applied to the exposed n$^+$ regions 172, such as by plating or aligned screen printing, as seen in FIG. 21.
8) The rear surface dielectric layer 184 is patterned as seen in FIG. 22, to create openings 226 for rear metallisation. This can be done by a laser 222, by screen printing or inkjet patterning or other, suitable known processes;
9) Referring to FIG. 23, hydrogenation of the p+ region of the rear surface is performed, in areas of silicon 231 where the dielectric 184 has not been removed (i.e. where hydrogen source is present), such as by heating the device to 400° C. in darkness or low light. This process maximises the H$^+$ percentage while retaining reasonable release of hydrogen into the silicon in such a way that boron is deactivated wherever hydrogen is present. Boron is deactivated, by hydrogen (H$^+$) which bonds with the negative boron atoms that are active in the silicon lattice. Hydrogenation performed in a manner which maximises the amount of H$^+$ present will enable the H$^+$ to bond with the B$^-$ thereby de-activating the boron and creating higher sheet, resistivity material in these regions, while leaving lower sheet resistivity regions 83 where the dielectric hydrogen, source 94 has been removed to form openings 136 for the subsequent formation of metal contacts. Note that the percentage of atomic hydrogen in the positive charge state is maximised by keeping the electron concentration low such as by minimising the light generation of carriers which is in turn minimised by minimising the light incident on the wafer which necessitates the use of heaters that radiate minimal light which has photons with energy levels above the bandgap of silicon (1.12 eV) and by avoiding temperatures above about 300-500° C. that are desirable for reasonable hydrogen mobility and the release of hydrogen from the dielectric hydrogen sources 184. For simplicity, the identical conditions have been described for phosphorus and boron deactivation so as to facilitate simultaneous deactivation of both the phosphorus at the front and boron at the rear. However for optimal electronic performance, different hydrogenation (deactivation) processing conditions may be beneficial for the phosphorus and boron such that the two processes should therefore be carried out separately.

Figure 24:
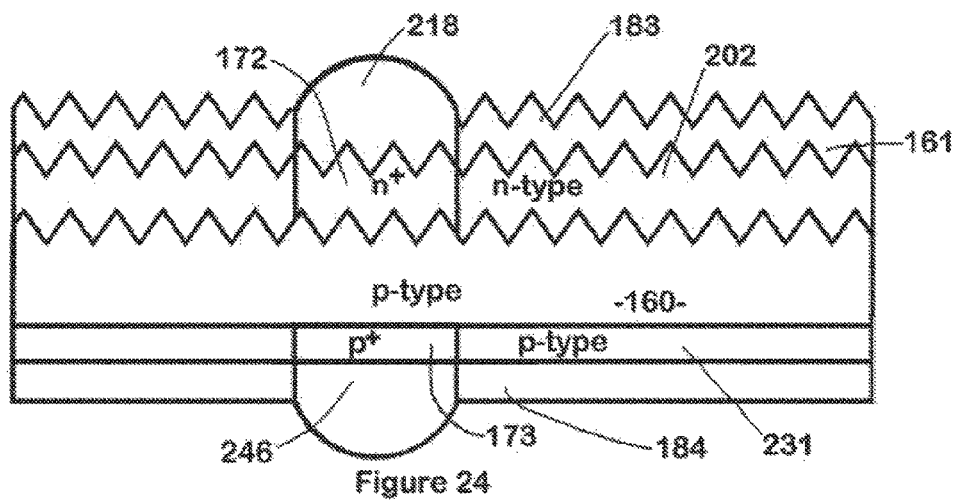
FIG. 24 diagrammatically illustrates the wafer of FIG. 23 after rear surface metallisation is applied.

10) Metal contacts 246 may then be applied to the exposed, p$^+$ regions 83, such as by plating or aligned screen printing, as seen in FIG. 24.

(iii) Example 3—Deactivation and Local Reactivation

Figure 25:
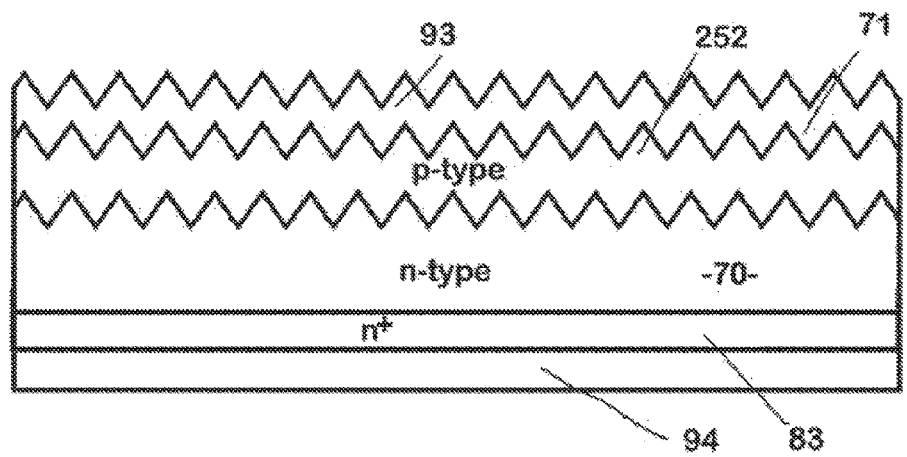
FIGS. 25 to 27 diagrammatically illustrate an alternative sequence for the patterning, metallisation and hydrogenation of the wafer to that shown in FIGS. 10, 11 and 12.

1) Referring to FIG. 25, hydrogenation is performed on a n-type wafer 70 similar to that see in FIG. 9 to produce a lightly doped emitter layer 252 prior to patterning of the top surface dielectric 93. This process manipulates the charge state in such a way that boron is deactivated wherever hydrogen is present. Boron is deactivated by hydrogen (H$^+$) which bonds with the negative boron atoms that are active in the silicon lattice. Hydrogenation performed in a manner which maximises the amount of H$^+$ present will enable the H$^+$ to bond with the B$^-$ thereby de-activating the boron and creating higher sheet resistivity material in these regions. As there is no patterning of the dielectric layer 93 there will be no remaining lower sheet resistivity regions 82. Note that, as before, the percentage of atomic hydrogen in the positive charge state is maximised by keeping the electron concentration low such as by minimising any light having photons with energy levels above the bandgap of silicon (1.12 eV) such as light generated by the heat sources and by avoiding temperatures above about 300-500° C. that are desirable for reasonable hydrogen mobility and the release of hydrogen from the dielectric hydrogen sources 93.

Figure 26:
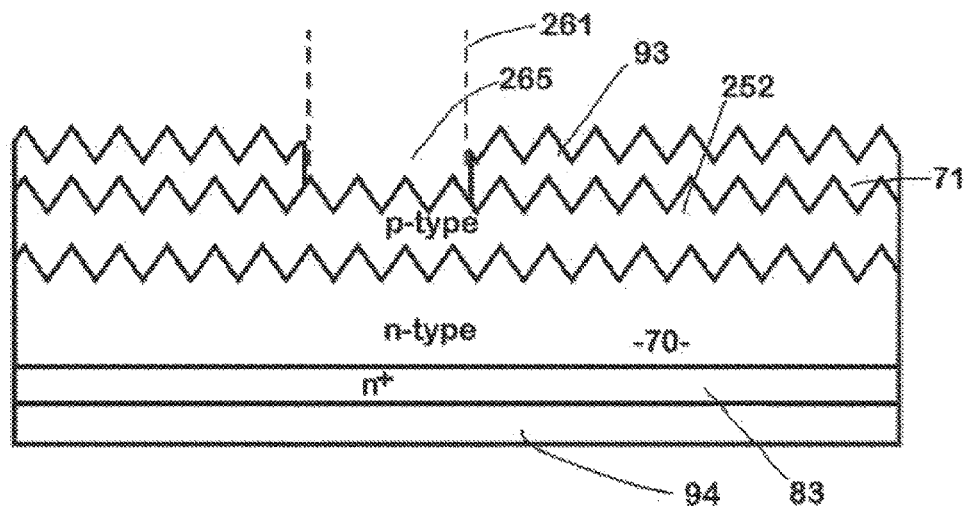
Figure 27:
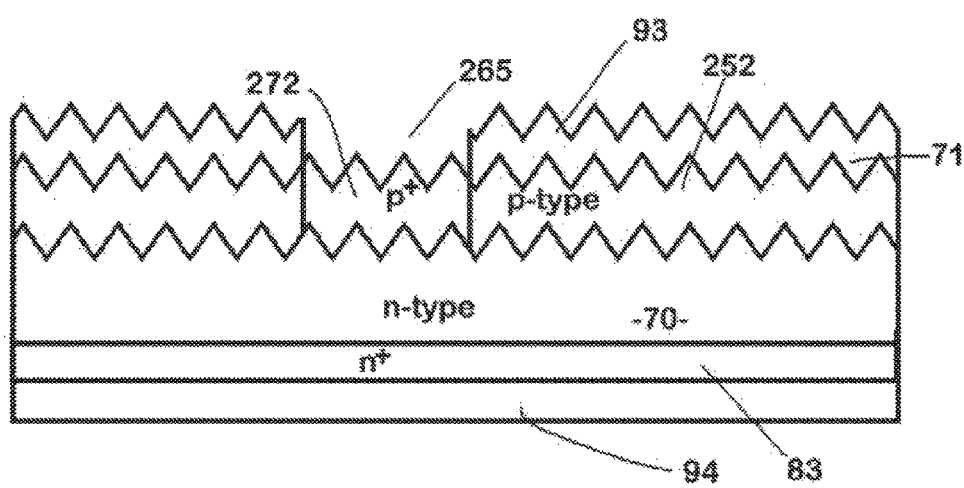

2) The front surface dielectric layer 93 is then patterned as seen in FIG. 26, to create openings 265 for emitter metallisation. This can be done by a laser 101, by screen printing or inkjet patterning or other suitable known processes. If a laser is used to open the front surface dielectric layer 93, the boron in the underlying p-type silicon may be simultaneously re-activated to create a p+ region 272, seen in FIG. 27, by controlling the light and heat applied to the silicon during the opening step. Note that the laser light not only ablates the dielectric locally, but also generates heat and electron-hole pairs within the surface of the silicon so as to raise the electron concentration, therefore allowing more of the bonded H (bonded to the boron atoms as previously discussed) in the localised area to be released and take on the neutral or even H— charge state and therefore escape from the B— atom. This therefore reactivates the boron atom. Alternatively if the opening 265 is formed by other means a subsequent step of heating with localised illumination may be used to reactivate the boron in the area 272 under the opening 165;

3) Metal contacts 128 may then be applied to the exposed p$^+$ regions 272, in the same manner that the metal contacts 128 are applied to the exposed p$^+$ regions 82 in FIG. 12, such as by plating or aligned screen printing, as seen in FIG. 12.

Figure 14:
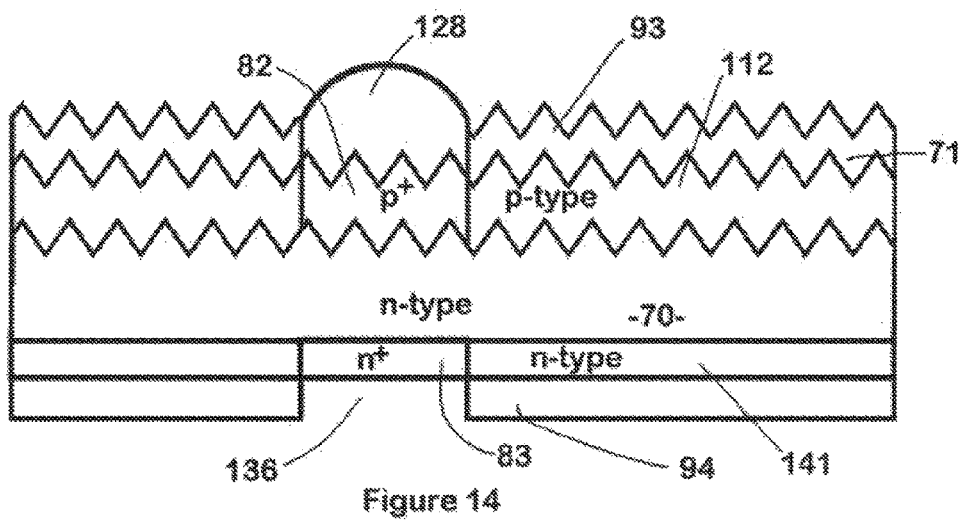
FIG. 14 diagrammatically illustrates the wafer of FIG. 13 after hydrogenation of the rear doped region.

A similar sequence to that of steps 1)-3) above may also be applied to modify the hydrogenation of the rear surface n$^+$ region 83, the opening of the rear surface dielectric 94, the deactivation of the phosphorus in the rear surface n$^+$ region 141 and the formation of the rear surface contacts 156, described with reference to FIGS. 13-15, however this may need different hydrogenation processing conditions for optimal charge state manipulation. The method described in steps 1)-3) above may also be applied to modify the processes described for the formation of devices formed in the p-type wafer illustrated in FIGS. 16-24.

(iv) Example 4—Deactivation on a Metallised Device

This approach relies on deactivation of the boron (or phosphorus) dopants after the dielectric hydrogen source has already been patterned, whereby the regions without dielectric coating do not receive significant levels of hydrogen (i.e. no hydrogen source) and therefore locally prevents its deactivation.

1) The first steps of this process are the same as for a device created in an n-type wafer 70 with surface dielectric layers 93, 94 and low sheet resistivity n$^+$ emitter 82 (1-100Ω/□), as previously described above with reference to FIGS. 7 & 8.

Figure 28:
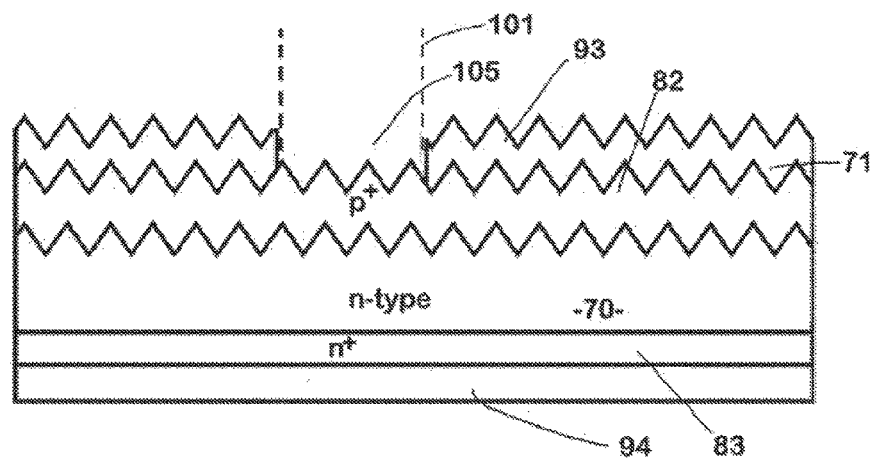
FIGS. 28 to 30 diagrammatically illustrate a further alternative sequence for the patterning, metallisation and hydrogenation of the wafer to that shown in FIGS. 10, 11 and 12.
Figure 29:
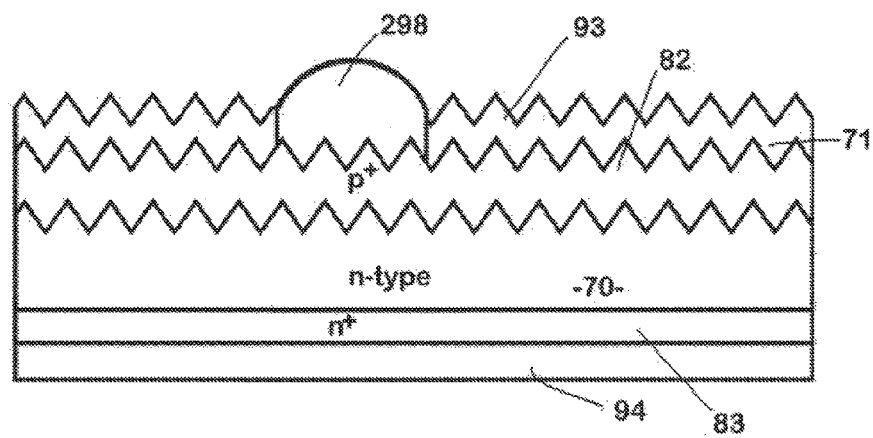

2) The front surface dielectric layer 93 is patterned as seen in FIG. 28 (as for the step described with reference to FIG. 9), to create openings 105 for emitter metallisation. This can be done by a laser 101, by screen printing or inkjet patterning or other suitable known processes;

3) At this stage, the hydrogenation process can be performed locally to deactivate dopants wherever the hydrogen source is still present or alternatively, metal contacts 298 may first be applied to the exposed p$^+$ regions 82, such as by plating or aligned screen, printing, as seen in FIG. 29 (similar to the step described with reference to FIG. 12), however in this latter case the emitter 82 has not yet been hydrogenated and is stilt an entirely p$^+$ region.

Figure 30:
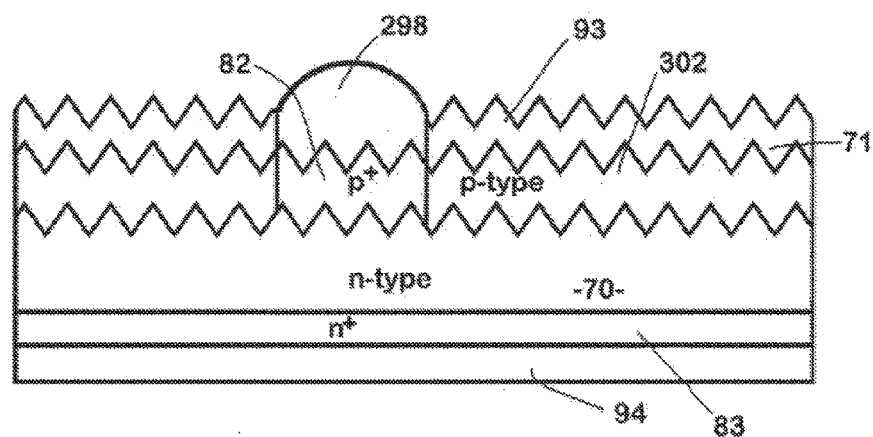

4) Referring to FIG. 30, if the hydrogenation process has not already been applied, a hydrogenation process is performed to deactivate most of the boron in the emitter 82 to produce a higher resistance p-type emitter 302 with a sheet resistance >100Ω/□, (typically 120-200Ω/□), while leaving the p$^+$ region 82 in the regions without the dielectric source and/or under the metal contact 298. This requires manipulating the charge state of hydrogen to enable high concentrations of H$^+$ to bond with and deactivate the B$^-$ in the parts of the emitter 302 directly exposed to the dielectric hydrogen source layer 93. This can be done by performing hydrogenation at a temperature preferably in the range 300-400° C. in the dark or with low illumination. Absence of the hydrogen source in the metallised areas will prevent the dopants being deactivated in such regions and the absence of light will limit the travel of most of the hydrogen beyond the areas under the remaining dielectric hydrogen source layer 93.

A similar sequence modification may also be applied to modify the hydrogenation of the rear surface n$^+$ region 83, the opening of the rear surface dielectric 94, the deactivation of the phosphorus in the rear surface n$^+$ region 141 and the formation of the rear surface contacts 156, described with reference to FIGS. 13-15, however this may need different hydrogenation processing conditions for optimal charge state manipulation. These methods may also be applied to modify the processes described for the formation of devices formed in the p-type wafer illustrated in FIGS. 16-24.

(iv) Example 5—Deactivation on a Metallised Device

Figure 31:
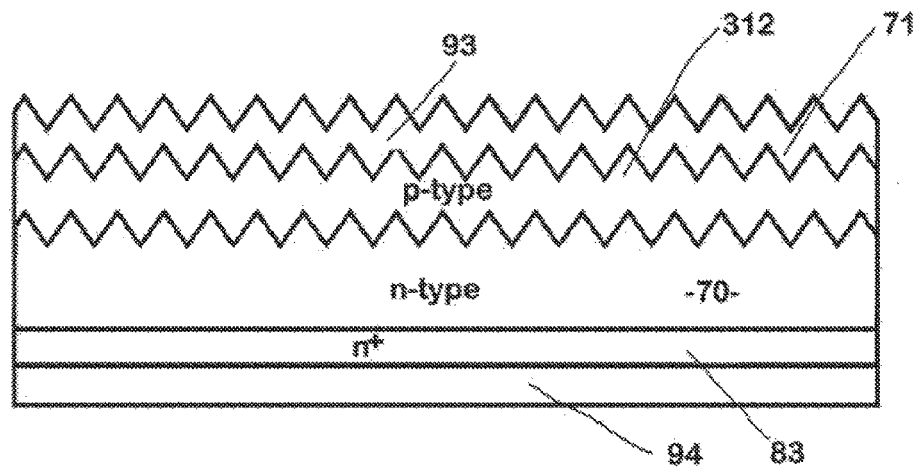
FIGS. 31 to 35 diagrammatically illustrate yet a further alternative sequence for the patterning, metallisation and hydrogenation of the wafer to that shown in FIGS. 10, 11 and 12.

Another variation of the processes described above is to deactivate all the boron to >100Ω/□ prior to metallisation to produce a structure which after metallisation still has higher resistance p-type material (i.e. >100Ω/□) under the metal contacts, and subsequently processing the material under the metal contacts to reactivate tire dopant. The variations to the above processes are as follows:

1) Starting with the wafer of FIG. 9 which has heavily doped surface regions 82 & 83 and dielectric hydrogen sources 93 & 94 applied, hydrogenation of the emitter is performed, in areas of silicon 312 under the dielectric hydrogen source layer 93, such as by heating the device to 400° C. in low light or dark conditions to achieve the arrangement seen in FIG. 31 (as per the process described with reference to FIG. 11) In this case the dielectric layer has not been opened and so the hydrogenation is applied to the entire p+ region 82 to form the p-type layer 312 with a sheet resistance >100Ω/□ (typically 120-200Ω/□). This process manipulates the hydrogen charge state in such a way that boron is deactivated wherever hydrogen is present. Boron is deactivated by hydrogen which bonds with the negative boron atoms that are active in the silicon lattice, Hydrogenation performed in a manner which maximises the amount of H$^+$ present will enable the H$^+$ to bond with the B$^-$ thereby deactivating the boron and creating higher sheet resistivity material in these regions. Note that the percentage of atomic hydrogen in the positive charge state is maximised by keeping the electron concentration low such as by minimising any light from the heaters which has photons with energy levels above the bandgap of silicon (1.12 eV) and by avoiding significantly above the typical range of 300-500° C. that is necessary for reasonable hydrogen mobility and the release of hydrogen from the dielectric hydrogen sources 93.

Figure 32:
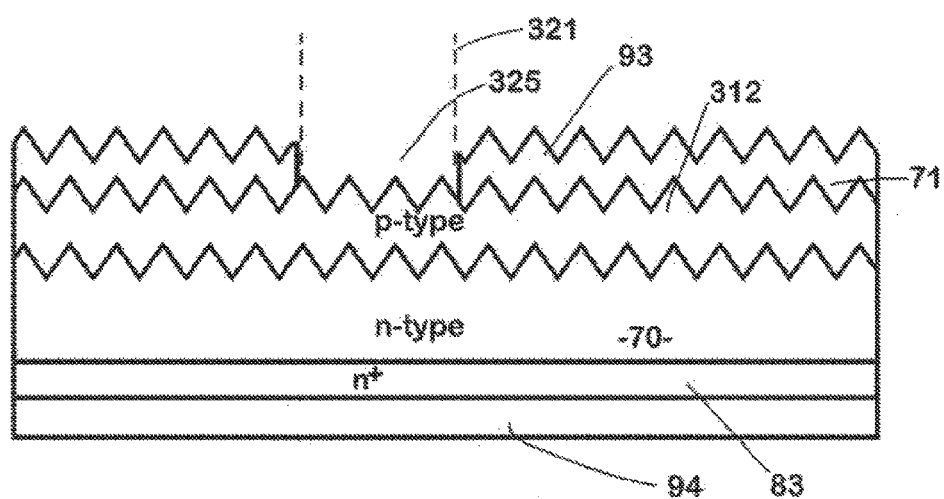
Figure 33:
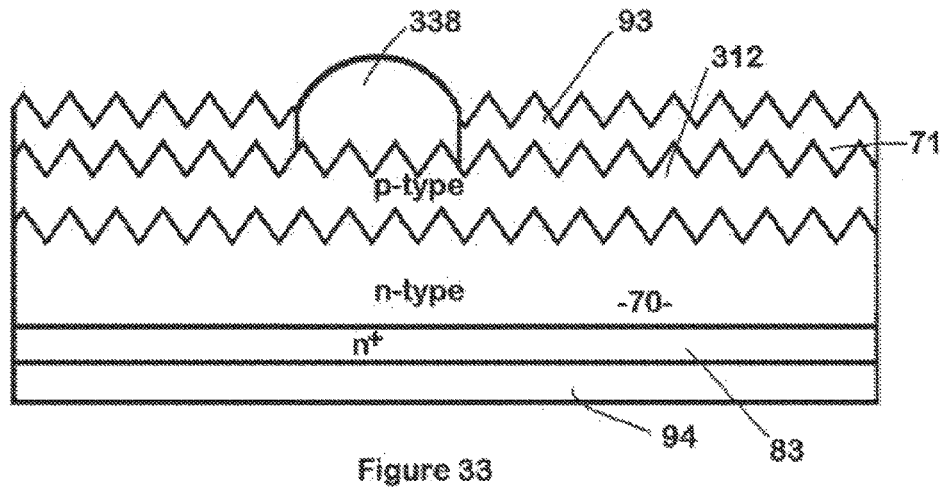

2) The front surface dielectric layer 93 is patterned as seen in FIG. 32, to create openings 325 for emitter metallisation. This can be done by a laser 321, by screen printing or inkjet patterning or other suitable known processes;

3) Metal contacts 338 may then be applied to the exposed p⁺ regions 312, such as by plating or aligned screen printing, as seen in FIG. 33.

Figure 34:
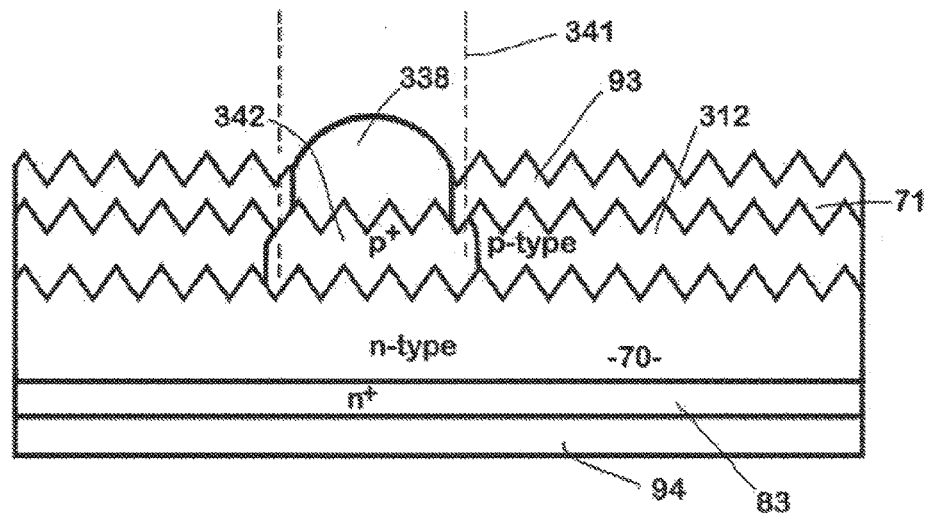

4) Referring to FIG. 34, a laser can then be used locally in the vicinity of the metallised regions 338 to raise the temperature of the silicon and the electron concentration (through light and thermally generated carriers) so as to reactivate the boron to create a p⁺ region 342 in the vicinity of the metal contacts 338. Note that in this implementation, the local reactivation of the dopants through the use of the laser requires some of the laser light to be absorbed within the silicon (to generate the electron-hole pairs to control the hydrogen charge-state) and therefore the laser 341 needs to be incident-locally on the silicon just adjacent to the metal contacts, whereby electron-hole pairs generated adjacent to the metal contacts 338 (i.e. just, outside the shadow of the metal contacts) are able to diffuse underneath the metal contacts 338 and therefore locally raise the electron concentration to facilitate the necessary control of the hydrogen charge and so facilitate, reactivation of the dopants. Because only a small-localised region of the silicon is heated by the laser, cooling is sufficiently rapid when the laser is removed relative to the lifetime of the hydrogen charge states and/or lifetime of the electron-hole pairs such that little opportunity is provided for the hydrogenation process to reverse.

Figure 35:
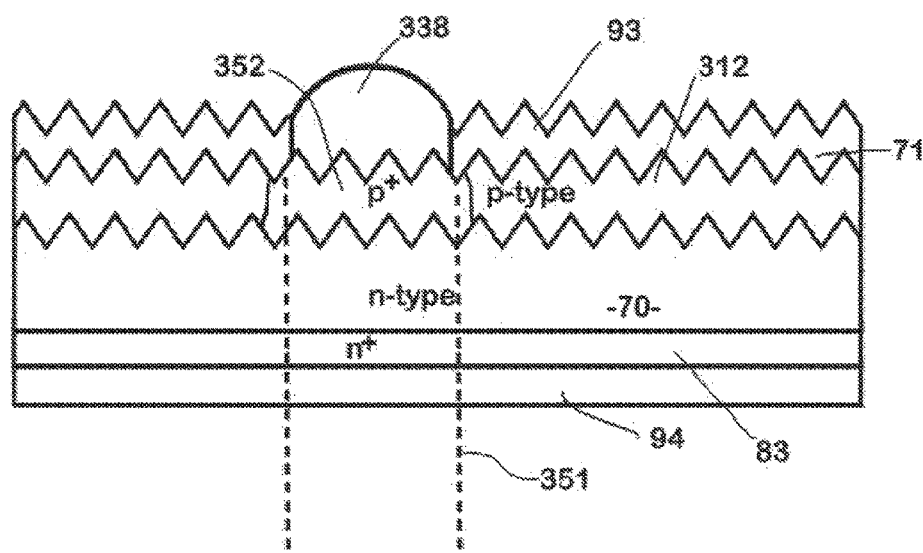

5) As an alternative to application of the laser to the front surface as described in 4) above, a laser 351 may be applied to the rear surface as seen in FIG. 35 to generate the p+ region 352.

Creating an Internal Hydrogen Source

The hydrogenation process as described above can be performed in such a way as to manipulate the charge states of the hydrogen so that it can facilitate either increased or decreased formation of the B—H bonds (deactivation of the boron atoms) and therefore also either increased or decreased breaking of the B—H bonds (with corresponding reactivation of the boron atoms).

Extra dopant atoms such as boron can be diffused, grown, implanted etc, into the silicon, and then in the presence of a hydrogen source such as from a dielectric, the extra dopants can be deactivated by a process that manipulates the charge state of hydrogen to enable high concentrations of H⁺ to bond with and deactivate the B⁻. For boron dopants, this can be done by performing hydrogenation at a temperature in the range 200-500° C. in the dark or with low illumination. Each boron atom that is deactivated is therefore bound to a hydrogen atom, so that hydrogen atoms can be located all throughout the silicon wafer in the areas that were deactivated by the hydrogenation process, essentially creating internal stores of hydrogen throughout the wafer. These hydrogen stores can then be accessed via a hydrogenation process by providing sufficient thermal energy to break the bonds while simultaneously raising the electron concentration sufficiently (such as via illumination with high enough intensity light) to increase the percentage of the atomic hydrogen in the neutral or negative charge states that can therefore escape from their respective boron atoms. Such released hydrogen is therefore again mobile and able to be used for other purposes, such as bulk or localised hydrogenation or passivation of surface, bulk or grain boundary defects in the silicon, either before or after completion of manufacture of the device. Bulk hydrogenation can be achieved by heating the whole devise under illumination, however as some structures of a completed or near completed device are temperature sensitive localised processing is also possible and may be preferable if only small areas require passivation treatment. Processing methods such as those described with reference to FIGS. 34 & 35 may be employed and need not be restricted to areas near a metal contact. It would be possible, for example to process an entire solar cell by scanning a laser over the surface of the cell to progressively heat and illuminate areas of the cell until the entire cell had been scanned. By adjusting the focus and power of the laser this process can be arranged to avoid damage to structures such as encapsulating layers present in a completed module by restricting the area and duration of heating at any point in the scan.

Belt Furnace Modification

Belt furnaces are commonly used for heat processing of semiconductor devices. By modifying a belt furnace to incorporate illumination sources in the heating and cooling stages, such that heating and cooling may be performed underillumination, belt furnaces may be used to perform hydrogenation or to redistribute hydrogen in the device being processed. Such a modified belt furnace may also be used in a "dark" mode with some or all of the illumination disabled for dark processing.

Figure 36:
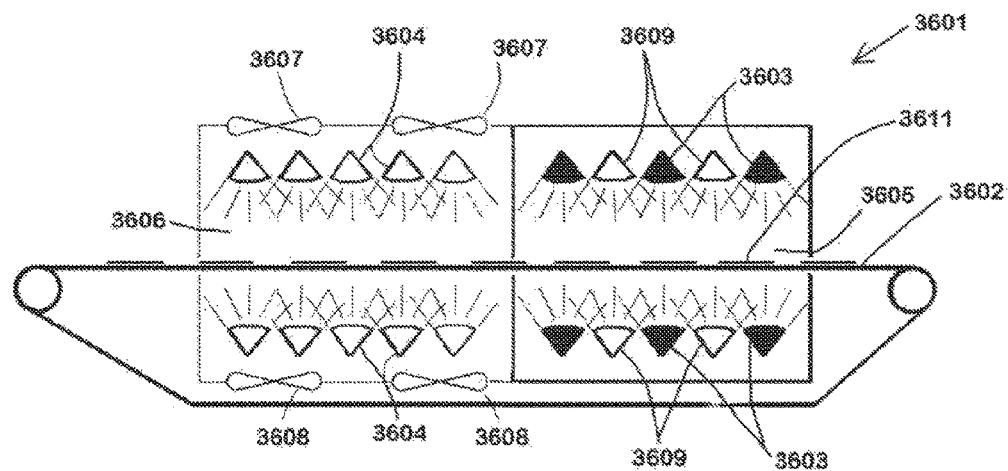
FIGS. 36 & 37 diagrammatically illustrate two examples of belt furnaces modified to provide illumination in the heating and cooling zones.

Referring to FIG. 36, a first modified belt furnace 3601 is illustrated. As with a conventional belt furnace, the furnace of FIG. 36 has a heat resistant belt 3602 (e.g. a ceramic roller or metal link style belt which passes through the furnace and extends from each end for loading and unloading. The furnace has a heating zone 3605 and a cooling zone 3606. Through which the belt passes. As with some conventional belt furnaces the heating zone has heating lamps 3603 which direct heat at the belt 3602 and anything carried on the belt, such as a wafer 3611 undergoing hydrogenation in the process to make a solar cell. The healing lamps 3603 typically produce radiant heat and may be high powered lights which produce large amounts of radiant heat such as infra-red lamps. In the present modified belt furnace, the heaters may be high powered lights which are chosen (or driven differently) to also provide high levels of light. Alternatively supplementary lighting 3609 may optionally also be provided. Ideally light levels from 0.1 suns up to 100 suns might be provided in the heating zone 3605. In the cooling zone of a conventional belt furnace, cooling is performed in the dark. However in the present modified belt furnace 3601, lamps 3604 are provided in the cooling zone 3606 such that solar cells processed in the belt furnace may be illuminated during cool-down. The lamps 3604 in the cooling zone may advantageously provide less heating than the lamps in the heating zone. This may be achieved by using cooler or more efficient (e.g. non infra-red) lamps, or by using infrared lamps and taking measures to minimise the heating effect or to provide additional forced cooling. For example the lamps 3604 in the cooling zone 3606 may be pulsed (taking advantage of the lifetime of the light induced charge states and/or the lifetime of the generated electron-hole pairs) to reduce their average heat output. Alternatively the cooling zone 3606 may optionally be cooled by passing cooling air through the cooling zone using inlet fans 3607 and exhaust fans 3608 to counteract any heating effects of the lamps 3604, to more rapidly bring the target device below a temperature at which the hydrogen passivated defects in the device will become stable. The cooling air may be chilled. Alternatively other gasses may be introduced at low temperature to assist cooling.

Figure 37:
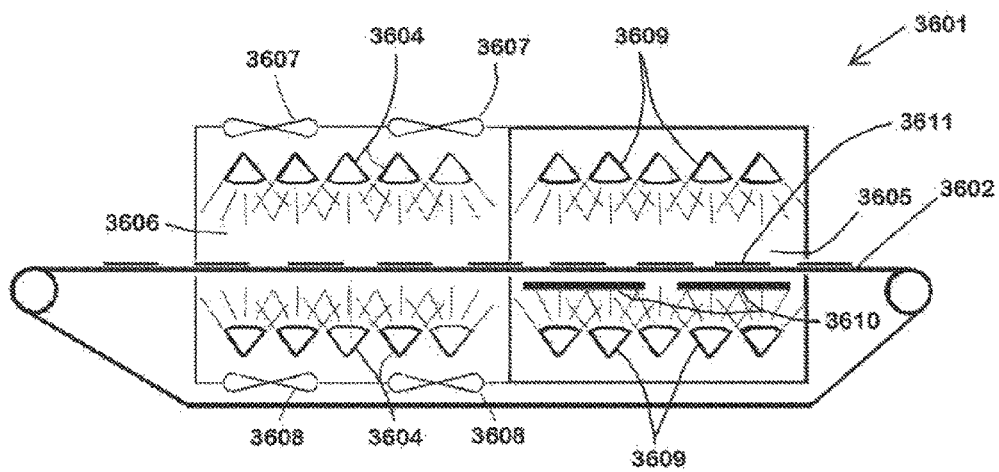

Referring to FIG. 37, a second modified belt furnace 3601 is illustrated. As with a conventional belt furnace, and also the previous example, the furnace of FIG. 37 has a heat resistant belt 3602 (e.g. a metal link style belt which passes through the furnace and extends from each end for loading and unloading). The furnace has a heating zone 3605 and a cooling zone 3606, through which the belt passes. As with some conventional belt furnaces the heating zone in this case has plate heaters 3610 which direct heat from beneath the belt 3602 to heat anything carried on the belt, such as a wafer 3611 undergoing hydrogenation in the process to make a solar cell. In this case supplementary lighting 3609 is provided in the heating zone 3605, as there would be no lighting in the heating zone of a conventional belt furnace which used plate or resistive heaters. Again, ideally light levels of up to 100 suns might be provided in the heating zone 3605. In the cooling zone of a conventional belt furnace, cooling is performed in the dark. However in the present modified belt furnace 3601, as with the previous example, lamps 3604 are provided in the cooling zone 3606 such that solar cells processed in the belt furnace may be illuminated during cool-down. The cooling zone 3606 of FIG. 37 may be identical to that of FIG. 36.

Localised Hydrogenation

Figure 38:
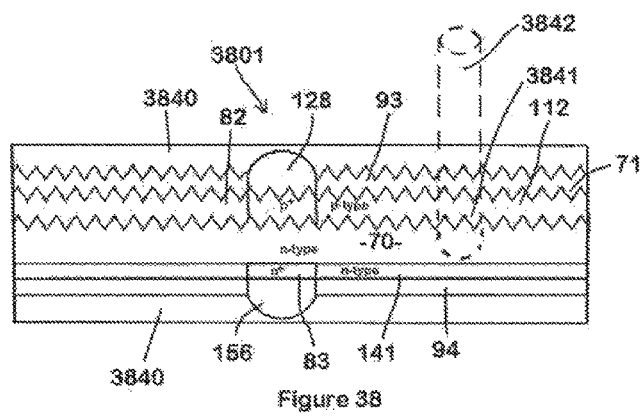
FIG. 38 illustrates and example of localised hydrogenation.

Referring to FIG. 38, a finished cell is illustrated including protective encapsulating layers 3840 over both surfaces. Localised hydrogenation processing or redistribution of hydrogen may be performed at any time during the manufacture of a cell and after the cell is completed as shown in FIG. 38. Localised processing involves performing hydrogenation on a small area of the cell to avoid damaging parts of the cell structure that may be damaged either by excessive heat or for which hydrogenation is not appropriate. If larger areas require hydrogenation then this may be achieved incrementally by scanning the heating and lighting source over the areas of the device to be processed at a rate that for example avoids excessive heating of the entire device.

Referring the FIG. 38, heating may be achieved by a laser 3842 which heats and illuminates a small zone 3841 of the device. The laser may be defocused to heat a larger area and to avoid over heating as the laser is scanned slowly over the surface of the device. The laser may also be pulsed to allow further control of temperature and lighting conditions. As the laser moves to a new zone (e.g. by scanning to an adjacent zone), the previous zone will cool quickly as heat is conducted away through the bulk of the device. Therefore direct illumination of the previous zone is not required during the cooling, as the cooling occurs sufficiently quickly that hydrogen charge states created during the heating/illumination of that zone and/or the electron hole pairs will have a sufficient lifetime to remain present until the zone has cooled sufficiently to avoid reversal of the hydrogenation.

The localised heat and light source may also be another type of light source rather than a laser. For example, the source might be an infra-red light source which is focused and shielded to illuminate only a selected area of the device at any given time. The light source may also be pulsed to control the temperature and illumination levels applied to the zone being hydrogenated.

This technique has the advantage that, provided adequate hydrogen source material was incorporated in the cell at manufacture, it may be used on installed solar cell arrays, amongst other uses, to repair or rejuvenate cells that have degraded in the field. It can also be used during manufacture to avoid damaging cells that progressed to a point in the manufacturing process where excessive heating of the entire device will damage the cell. For example it is possible to treat areas away from the metallisation, while avoiding heating the metallised areas, which if heated excessively could result in the metal penetrating an underlying junction.

The invention claimed is:

1. A method for processing of a crystalline silicon device, having a plurality of crystalline silicon regions, at least one crystalline silicon region having a plurality of crystallographic defects or contaminants, the at least one crystalline silicon region being a doped crystalline silicon region in which some dopant atoms are deactivated by combining with a hydrogen atom, the method comprising:
reactivating some deactivated dopant atoms by heating and illuminating the doped crystalline silicon region to break at least some bonds between dopant atoms and hydrogen atoms while maintaining conditions to create a relatively high concentration of neutral or negative hydrogen atoms, whereby some of the hydrogen atoms diffuse from the doped crystalline silicon region without re-bonding to the dopant atoms; and
subsequently heating at least a portion of the doped crystalline silicon region to bond some or all of the neutral or negative hydrogen atoms to the crystallographic defects or contaminants in the at least one crystalline silicon region.

2. The method as claimed in claim 1, wherein after heating and illuminating the doped crystalline silicon region, a cooling period is provided during which illumination is maintained to maintain the relatively high concentration of neutral or negative hydrogen atoms.

3. The method as claimed in claim 2, wherein some or all of the deactivated dopant atoms in a selected crystalline silicon region are subsequently reactivated by subjecting the dopant atoms in the selected crystalline silicon region to heat and illuminating a crystalline silicon region adjacent to the selected crystalline silicon region, whereby electron hole pairs are generated to increase a proportion of minority carriers in the crystalline silicon region adjacent to the selected crystalline silicon region and such that the minority carriers generated in the crystalline silicon region adjacent to the selected crystalline silicon region diffuse to the selected crystalline silicon region.

4. The method as claimed in claim 3, wherein the selected crystalline silicon region is allowed to cool to below 120° C. within a carrier lifetime of the minority carriers or within a life expectancy of neutral hydrogen atoms or a hydrogen atom of a same charge state as the dopant atoms in the selected crystalline silicon region.

5. The method as claimed in claim 3, wherein heating, illumination, or both heating and illumination of the selected crystalline silicon region and the crystalline silicon region adjacent to the selected crystalline silicon region is performed with a laser.

6. The method as claimed in claim 1, further comprising, prior to reactivating:
doping the crystalline silicon device with dopant atoms of a first dopant polarity to create the doped crystalline silicon region with a dopant atom concentration greater than a required final active dopant atom concentration in the doped crystalline silicon region, and
deactivating some of the dopant atoms in the doped crystalline silicon region by introducing hydrogen atoms into the doped crystalline silicon region, whereby some of the hydrogen atoms bond with some or all of the dopant atoms of the first dopant polarity to deactivate the dopant atoms having the first dopant polarity.

7. The method as claimed in claim 1, wherein the doped crystalline silicon region is a surface region of the crystalline silicon device.

8. The method as claimed in claim 1, wherein heating and illumination of the dopant atoms are performed with a laser.

9. The method as claimed in claim 8, wherein the laser is scanned over a plurality of crystalline silicon regions.

10. The method as claimed in claim 1, wherein hydrogen atoms are introduced into the crystalline silicon device by forming a dielectric hydrogen source on a surface of the at least one crystalline silicon region and subsequently heating the device to migrate the hydrogen atoms into the at least one crystalline silicon region.

11. The method as claimed in claim 10, wherein hydrogen atoms are introduced into the crystalline silicon device from the dielectric hydrogen source to deactivate dopant atoms in a surface region of the at least one crystalline silicon region, by heating the device in an absence of illumination or in low illumination conditions.

12. The method as claimed in claim 10, wherein dielectric hydrogen sources are formed on each of a front and a rear crystalline silicon surface of the crystalline silicon device.

13. The method as claimed in claim 10, wherein the crystalline silicon device comprises a crystalline silicon surface n-type diffused layer through which hydrogen must diffuse, the crystalline silicon surface n-type diffused layer having a net active doping concentration of $1 \times 10^{20}$ atoms/$cm^3$ or less.

14. The method as claimed in claim 10, wherein the crystalline silicon device comprises a crystalline silicon surface p-type diffused layer through which hydrogen must diffuse, the crystalline silicon surface p-type diffused layer having a net active doping concentration of $1 \times 10^{19}$ atoms/$cm^3$ or less.

15. The method as claimed in claim 1, wherein heating of the crystalline silicon device comprises heating at least a crystalline silicon region of the device to at least 40° C. while simultaneously illuminating at least some of the crystalline silicon device with at least one light source, whereby a cumulative power of incident photons with sufficient energy to generate electron hole pairs within the crystalline silicon device is at least 20 mW/$cm^2$.

16. The method as claimed in claim 1, wherein illumination of the crystalline silicon device is from at least one light source and is provided at a level whereby a cumulative power of incident photons with sufficient energy to generate electron hole pairs within the crystalline silicon device is at least 50 mW/$cm^2$, or 60 mW/$cm^2$, or 70 mW/$cm^2$, or 80 mW/$cm^2$, or 90 mW/$cm^2$, or 100 mW/$cm^2$, or 150 mW/$cm^2$, or 200 mW/$cm^2$, or 300 mW/$cm^2$, or 400 mW/$cm^2$, or 500 mW/$cm^2$, or 600 mW/$cm^2$, or 700 mW/$cm^2$, or 800 mW/$cm^2$, or 900 mW/$cm^2$, or 1000 mW/$cm^2$, or 1500 mW/$cm^2$, or 2000 mW/$cm^2$, or 3000 mW/$cm^2$, or 5000 mW/$cm^2$, or 10000 mW/$cm^2$, or 15000 mW/$cm^2$, or 20000 mW/$cm^2$, or up to a light intensity at which crystalline silicon begins to melt.

17. The method as claimed in claim 1, wherein heating of the crystalline silicon device at a range of cumulative power comprises heating at least a region of the device to at least 100° C.

18. The method as claimed in claim 1, wherein heating of the crystalline silicon device comprises heating the device to at least 140° C., to at least 180° C., to at least 200° C., or to at least 400° C.

19. The method as claimed in claim 1, wherein heating of the crystalline silicon device comprises heating the device to at least 500° C., or to at least 600° C., or to at least 700° C., or to at least 800° C., or to at least 900° C., or to at least 1,000° C., or to at least 1,200° C. or to a temperature at which crystalline silicon begins to melt.

20. The method as claimed in claim 1, wherein heating of the crystalline silicon device is followed by cooling the crystalline silicon device while simultaneously illuminating at least some of the crystalline silicon device with at least one light source, whereby a cumulative power of incident photons with sufficient energy to generate electron hole pairs within the crystalline silicon device is at least 20 mW/$cm^2$.

21. The method as claimed in claim 1, wherein a minority carrier concentration is controlled, through use of light and heat, during a cool-down period after heating, and any post-hydrogenation thermal processes, to maintain a hydrogen charge state during the cool-down period to minimize reactivation of defects to which a hydrogen atom was previously bound.

22. The method as claimed in claim 1, wherein the crystalline silicon device is illuminated with an array of LEDs.

23. The method as claimed in claim 1, wherein pulsed illumination is applied to the crystalline silicon device.

24. The method as claimed in claim 1, wherein an intensity of illumination applied to the crystalline silicon device is controlled to maintain a Fermi level at a value of 0.10 to 0.22 ev above mid-gap.

25. The method as claimed in claim 1, wherein the crystalline silicon device comprises a photovoltaic device having at least one rectifying junction.

26. The method as claimed in claim 1, wherein the doped crystalline silicon region is doped with a p-type (valency 3) dopant selected from boron, aluminium and gallium.

* * * * *